United States Patent
Kawamura et al.

(10) Patent No.: US 11,322,711 B2
(45) Date of Patent: *May 3, 2022

(54) ORGANIC EL LIGHT EMITTING APPARATUS AND ELECTRONIC INSTRUMENT

(71) Applicant: IDEMITSU KOSAN CO., LTD., Tokyo (JP)

(72) Inventors: Yuichiro Kawamura, Sodegaura (JP); Kazuki Nishimura, Sodegaura (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/077,601

(22) Filed: Oct. 22, 2020

(65) Prior Publication Data

US 2021/0043866 A1 Feb. 11, 2021

Related U.S. Application Data

(63) Continuation of application No. 16/060,051, filed as application No. PCT/JP2016/086488 on Dec. 8, 2016, now Pat. No. 10,854,838.

(30) Foreign Application Priority Data

Dec. 8, 2015 (JP) .................................. 2015-239608

(51) Int. Cl.
*H01L 29/08* (2006.01)
*H01L 51/52* (2006.01)
(Continued)

(52) U.S. Cl.
CPC ...... *H01L 51/5221* (2013.01); *H01L 27/3211* (2013.01); *H01L 27/3246* (2013.01);
(Continued)

(58) Field of Classification Search
CPC .................................................. H01L 51/5221
See application file for complete search history.

(56) References Cited

U.S. PATENT DOCUMENTS

2010/0090209 A1 4/2010 Ikari et al.
2010/0090238 A1 4/2010 Mori
(Continued)

FOREIGN PATENT DOCUMENTS

CN 1921140 A 2/2007
CN 103443949 A 12/2013
(Continued)

OTHER PUBLICATIONS

Edited by Chihaya ADACHI, "Translation of Yuki Hando-tai no Debaisu Bussei (Device Physics of Organic Semiconductors)," published by Kodansha, Apr. 1, 2012, 19 pages (with English translation).
(Continued)

*Primary Examiner* — Caleb E Henry
(74) *Attorney, Agent, or Firm* — Oblon, McClelland, Maier & Neustadt, L.L.P.

(57) ABSTRACT

An organic EL apparatus (1) includes a plurality of pixels including a first pixel (10) and a second pixel (20), in which the first pixel (10) has a first emitting layer (15) containing a fluorescent first compound, the second pixel (20) has a second emitting layer (25) containing a delayed fluorescent second compound, and the first pixel (10) and the second pixel (20) share a common layer (50) extending across the first pixel (10) and the second pixel (20).

31 Claims, 5 Drawing Sheets

(51) Int. Cl.
  *H05B 33/12* (2006.01)
  *H01L 51/50* (2006.01)
  *H01L 27/32* (2006.01)

(52) U.S. Cl.
  CPC ........ *H01L 51/504* (2013.01); *H01L 51/5012* (2013.01); *H01L 51/5036* (2013.01); *H01L 51/5056* (2013.01); *H01L 51/5072* (2013.01); *H01L 51/5092* (2013.01); *H01L 51/5206* (2013.01); *H05B 33/12* (2013.01)

(56) References Cited

U.S. PATENT DOCUMENTS

| | | | |
|---|---|---|---|
| 2010/0090592 A1 | 4/2010 | Shiobara | |
| 2010/0090593 A1 | 4/2010 | Mori | |
| 2012/0126205 A1 | 5/2012 | Kawamura et al. | |
| 2012/0248968 A1 | 10/2012 | Ogiwara et al. | |
| 2013/0277656 A1 | 10/2013 | Seo et al. | |
| 2014/0027734 A1* | 1/2014 | Kwong | H01L 51/0071 257/40 |
| 2014/0145151 A1* | 5/2014 | Xia | H01L 51/0071 257/40 |
| 2014/0326985 A1 | 11/2014 | Mizuki et al. | |
| 2016/0130225 A1 | 5/2016 | Tasaki et al. | |
| 2016/0172599 A1 | 6/2016 | Ogiwara et al. | |
| 2016/0190478 A1 | 6/2016 | Nakanotani et al. | |

FOREIGN PATENT DOCUMENTS

| | | |
|---|---|---|
| EP | 2 175 491 | 4/2010 |
| JP | 2006-13469 A | 1/2006 |
| JP | 2007-66862 A | 3/2007 |
| JP | 2010-114428 A | 5/2010 |
| JP | 2013-120770 A | 6/2013 |
| JP | 2013-239703 A | 11/2013 |
| JP | 2013-543250 A | 11/2013 |
| JP | 2014-165261 A | 9/2014 |
| WO | WO 2010/134350 A1 | 11/2010 |
| WO | WO 2010/143434 A1 | 12/2010 |
| WO | WO 2012/070234 A1 | 5/2012 |
| WO | WO 2013/077405 A1 | 5/2013 |
| WO | WO 2014/208698 A1 | 12/2014 |
| WO | WO 2015/022974 A1 | 2/2015 |
| WO | WO 2015/159706 A1 | 10/2015 |
| WO | WO 2016/129536 A1 | 8/2016 |

OTHER PUBLICATIONS

International Search Report dated Mar. 7, 2017 in PCT/JP2016/086488 filed Dec. 8, 2016.
Extended European Search Report dated Jul. 12, 2019 in corresponding European Patent Application No. 16873053.9, 10 pages.
Combined Office Action and Search Report dated Oct. 8, 2019 in Chinese Patent Application No. 201680070586.6, 13 pages (with English translation of categories of cited documents).
Japanese Office Action dated Mar. 17, 2020, in Patent Application No. 2017-555121, 3 pages.
Combined Chinese Office Action and Search Report dated May 9, 2020 in corresponding Chinese Patent Application No. 201680070586.6 (with English Translation of Category of Cited Documets, 15 pages.
Office Action as received in the corresponding JP patent application No. 2017-555121, dated Aug. 4, 2020.
Japanese Office Action dated Jun. 22, 2021 in Japanese Patent Application No. 2020-15221, 2 pages.

* cited by examiner

ORGANIC EL LIGHT EMITTING APPARATUS AND ELECTRONIC INSTRUMENT

TECHNICAL FIELD

The present invention relates to an organic EL apparatus and an electronic device.

BACKGROUND ART

A light-emitting apparatus usable for a display is typically exemplified by a liquid crystal display. However, in recent years, an organic EL apparatus using an organic electroluminescence device (hereinafter, occasionally abbreviated as an organic EL device) has been practically used as a new type of the light-emitting apparatus. The organic EL device includes an emitting zone (in which an emitting layer is included) between an anode and a cathode and emits light using exciton energy generated by a recombination of holes and electrons that have been injected into the emitting layer.

The light-emitting apparatus used for a color display is exemplified by a three-color light-emitting apparatus. In the three-color light-emitting apparatus, a color display is obtained by forming devices capable of respectively emitting light in three primary colors of red (R), green (G) and blue (B) and controlling a luminous intensity of each of the devices in the three colors.

For instance, Patent Literature 1 discloses an organic EL device including an anode, cathode, hole transporting zone, emitting layer, and electron transporting zone, in which the emitting layer includes a red emitting layer, green phosphorescent layer and blue fluorescent layer, and the electron transporting zone includes a common electron transporting layer adjacent to the red emitting layer, green phosphorescent layer and blue fluorescent layer. In the organic EL device of Patent Literature 1, a material satisfying a condition that an affinity difference between the material and a host of the green phosphorescent layer is 0.4 eV or less is used as a material forming the electron transporting layer.

CITATION LIST

Patent Literature(S)

Patent Literature 1: International Publication No. WO2010/143434

SUMMARY OF THE INVENTION

Problems to be Solved by the Invention

An object of the invention is to provide an organic EL apparatus allowing a wide variety of choices of compounds usable in a common layer extending across a plurality of pixels to be shared by the pixels, the organic EL apparatus being capable of prolonging a lifetime, and to provide an electronic device including the organic EL apparatus.

Means for Solving the Problems

According to an aspect of the invention, an organic EL apparatus includes a plurality of pixels including a first pixel and a second pixel, in which the first pixel includes a first emitting layer containing a fluorescent first compound, the second pixel includes a second emitting layer containing a delayed fluorescent second compound, and the first pixel and the second pixel share a common layer extending across the first pixel and the second pixel.

According to another aspect of the invention, an electronic device includes the organic EL apparatus according to the above aspect.

According to the above aspects of the invention, an organic EL apparatus allowing a wide variety of choices of compound usable in a common layer shared by a plurality of pixels, the organic EL apparatus being capable of prolonging a lifetime can be provided, and an electronic device including the organic EL apparatus can be provided.

DESCRIPTION OF EMBODIMENTS

First Exemplary Embodiment

Figure 1:
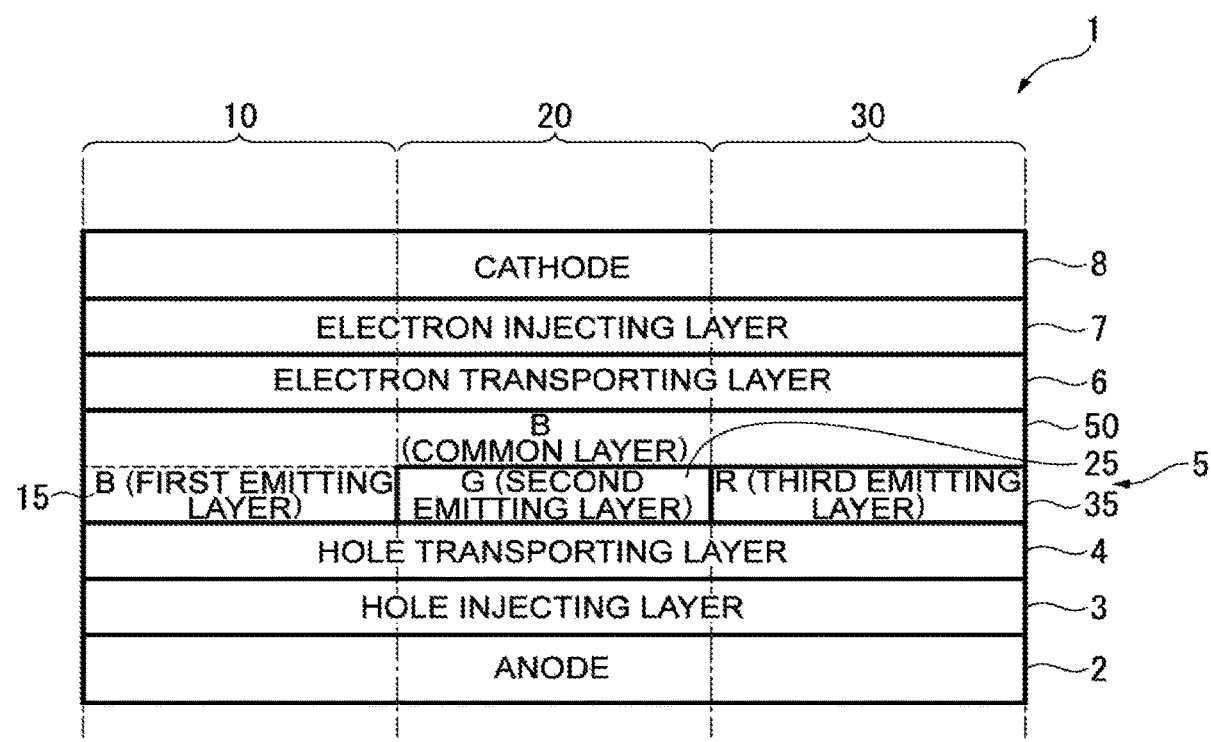
FIG. 1 schematically shows an organic EL apparatus according to a first exemplary embodiment.

FIG. 1 schematically shows an organic EL apparatus 1 according to a first exemplary embodiment.

The organic EL apparatus 1 includes a first pixel 10, a second pixel 20 and a third pixel 30. In the organic EL apparatus 1 of the exemplary embodiment, the first pixel 10, the second pixel 20, and third pixel 30 are provided in parallel to each other. In the exemplary embodiment, the organic EL apparatus 1 in which the first pixel 10 emits a blue light, the second pixel 20 emits a green light, and the third pixel 30 emits a red light will be described as an example. Each pixel of the organic EL apparatus 1 has a structure as an organic EL device (the same applies to subsequent exemplary embodiments and the like).

The organic EL apparatus 1 includes an anode 2, hole injecting layer 3, hole transporting layer 4, emitting zone 5, common layer 50, electron transporting layer 6, electron injecting layer 7, and cathode 8. The anode 2, hole injecting layer 3, hole transporting layer 4, emitting zone 5, common layer 50, electron transporting layer 6, electron injecting layer 7, and cathode 8 are laminated in this order.

The emitting zone 5 has different structures in the first pixel 10, the second pixel 20 and the third pixel 30. The emitting zone 5 includes: a first emitting layer 15 in the first pixel 10; a second emitting layer in the second pixel 20; and a third emitting layer 35 in the third pixel 30.

Common Layer

The common layer 50 is provided between the anode 2 and the cathode 8 and extends across the first pixel 10, the second pixel 20 and the third pixel 30 to be shared by the first pixel 10, the second pixel 20 and the third pixel 30. The common layer 50 is provided between the emitting zone 5 and the electron transporting layer 6. The common layer 50 is in contact with a side of the emitting zone 5 close to the cathode.

The common layer 50 contains the same compound as the first emitting layer 15 does. The common layer 50 does not contain a delayed fluorescent compound. The common layer 50 preferably does not contain a phosphorescent metal complex. When the first emitting layer 15 contains a plurality of kinds of compounds, the common layer 50 also contains the same kinds of the compounds as the first emitting layer 15 does. Herein, containing the same compound means that, for instance, when the first emitting layer 15 contains an X compound and a Y compound, the common layer 50 also contains the X compound and the Y compound. Specifically, herein, containing the same compound means that a compound contained in the first emitting layer 15 is substantially identical with a compound contained in the common layer 50. Examples of cases referred to as being substantially identical includes: a case where the compound contained in the first emitting layer is identical with the compound contained in the common layer; and a case where a difference between the compound contained in the first emitting layer and the compound contained the common layer is caused by a minute amount of impurities and the like derived from a starting material for the first emitting layer and the common layer and inevitably mixed in the first emitting layer and the common layer at the formation thereof.

In contrast, as exemplified by: a case where the first emitting layer 15 contains an X compound and a Y compound and the common layer 50 contains the X compound, the Y compound, and a Z compound; a case where the first emitting layer 15 contains the X compound and the Y compound, but the common layer 50 contains the X compound and no Y compound; and a case where the first emitting layer 15 contains the X compound, the Y compound, and the Z compound, but the common layer 50 contains the Z compound, no X compound and no Y compound, such a case as the compound contained in the first emitting layer 15 is substantially not identical with the compound contained in the common layer 50 is not interpreted as the case where the first emitting layer 15 and the common layer 50 contain the same compound.

Since the common layer 50 contains the same compound as the first emitting layer 15 does in the exemplary embodiment, a manufacturing process of the organic EL apparatus 1 can be simplified. For instance, when the second emitting layer 25 and the third emitting layer 35 are formed and subsequently the common layer 50 is formed extending across the first pixel 10, the second pixel 20 and the third pixel 30 to be shared by the first pixel 10, the second pixel 20 and the third pixel 30, it follows that the common layer 50 can serve also as the first emitting layer 15 of the first pixel 10.

First Pixel

The first pixel 10 includes the anode 2, hole injecting layer 3, hole transporting layer 4, first emitting layer 15, common layer 50, electron transporting layer 6, electron injecting layer 7 and cathode 8. The emitting zone 5 of the first pixel 10 includes the first emitting layer 15 (non-common layer) between the hole transporting layer 4 and the electron transporting layer 6.

The first emitting layer 15 includes a fluorescent first compound and a third compound. The first emitting layer 15 does not contain a delayed fluorescent compound. The first emitting layer 15 preferably does not contain a phosphorescent metal complex.

A singlet energy $S1(B_D)$ of the first compound and a singlet energy $S1(B_H)$ of the third compound satisfy a relationship of $S1(B_H) > S1(B_D)$.

Since the first emitting layer 15 and the common layer 50 contain the same compound in the exemplary embodiment, the common layer also contains the first compound and the third compound. With this arrangement, the entire organic compound layer (i.e., the first emitting layer 15 and the common layer 50) provided between the hole transporting layer 4 and the electron transporting layer 6 in the first pixel 10 can be said to function as the emitting layer.

In the organic EL apparatus 1, an energy gap $T_{77K}(B_D)$ at 77K of the first compound and the energy gap $T_{77K}(B_H)$ at 77K of the third compound preferably satisfy a relationship of $T_{77K}(B_D) > T_{77K}(B_H)$. The energy gap at 77K will be described later.

The first compound is preferably a blue fluorescent compound. An emission peak wavelength of the first compound is preferably in a range from 400 nm to 480 nm, more preferably in a range from 430 nm to 470 nm.

Herein, the emission peak wavelength means a peak wavelength of a luminescence spectrum having the maximum luminous intensity among luminescence spectra measured using a toluene solution in which a target compound is dissolved at a concentration in a range from $10^{-6}$ mol/L to $10^{-5}$ mol/L.

Second Pixel

The second pixel 20 includes the anode 2, the hole injecting layer 3, the hole transporting layer 4, a second emitting layer 25, the common layer 50, the electron transporting layer 6, the electron injecting layer 7 and the cathode 8. The emitting zone 5 of the second pixel 20 includes the second emitting layer 25 (non-common layer) between the hole transporting layer 4 and the electron transporting layer 6. The second emitting layer 25 is in contact with the common layer 50.

The second emitting layer 25 contains a sixth compound, a delayed fluorescent second compound, and a fluorescent fifth compound. The second emitting layer 25 and the common layer 50 contain different compounds. The second emitting layer does not contain a phosphorescent metal complex.

The fifth compound is preferably a green fluorescent compound. The second emitting layer 25 preferably emits green light. A peak wavelength of emission from the second emitting layer 25 is preferably in a range from 480 nm to 580 nm, more preferably in a range from 500 nm to 560 nm.

Third Pixel

The third pixel 30 includes the anode 2, the hole injecting layer 3, the hole transporting layer 4, a third emitting layer 35, the common layer 50, the electron transporting layer 6, the electron injecting layer 7 and the cathode 8. The emitting zone 5 of the third pixel 30 includes the third emitting layer 35 (non-common layer) between the hole transporting layer 4 and the electron transporting layer 6. The third emitting layer 35 is in contact with the common layer 50.

The third emitting layer 35 contains a ninth compound, a delayed fluorescent seventh compound, and a fluorescent eighth compound. The third emitting layer 35 and the common layer 50 contain different compounds. The third emitting layer 35 does not contain a phosphorescent metal complex.

The eighth compound is preferably a red fluorescent compound. The third emitting layer 35 preferably emits red light. A peak wavelength of emission from the third emitting layer 35 is preferably in a range from 580 nm to 700 nm, more preferably in a range from 600 nm to 680 nm.

The peak wavelength of the emission from the first emitting layer 15 is preferably smaller than the peak wavelength of the emission from the second emitting layer 25, and further the peak wavelength of the emission from the second emitting layer 25 is preferably smaller than the peak wavelength of the emission from the third emitting layer 35.

Delayed Fluorescence

Delayed fluorescence (thermally activated delayed fluorescence) is explained in "Yuki Hando-tai no Debaisu Bussei (Device Physics of Organic Semiconductors)" (edited by ADACHI, Chihaya, published by Kodansha, issued on Apr. 1, 2012, on pages 261-268). According to this literature, when an energy gap $\Delta E_{13}$ between the singlet state and the triplet state of a fluorescent material can be reduced, inverse energy transfer from the triplet state to the singlet state, which usually occurs at a low transition probability, occurs at a high transition probability to cause thermally activated delayed fluorescence (TADF). Further, FIG. 10.38 in this literature illustrates an occurrence mechanism of the delayed fluorescence. The delayed fluorescent compound of the first exemplary embodiment is a compound exhibiting thermally activated delayed fluorescence caused by this mechanism. Occurrence of delayed fluorescence emission can be determined by transient PL (Photo Luminescence) measurement.

The behavior of delayed fluorescence can be analyzed based on the decay curve obtained by the transient PL measurement. The transient PL measurement is a process where a sample is irradiated with a pulse laser to be excited, and a decay behavior (transient characteristics) of PL emission after the irradiation is stopped is measured. PL emission using a TADF material is divided into an emission component from singlet excitons generated by the first PL excitation and an emission component from singlet excitons generated via triplet excitons. The lifetime of the singlet excitons generated by the initial PL excitation is in a nano-second order and considerably short. Emission from these singlet excitons thus decays immediately after the irradiation with the pulse laser.

In contrast, delayed fluorescence, which is emission from the singlet excitons generated via long-life triplet excitons, decays slowly. There is thus a large difference in time between emission from the singlet excitons generated by the initial PL excitation and emission from the singlet excitons generated via triplet excitons. Therefore, a luminous intensity resulting from the delayed fluorescence can be obtained.

Figure 2:
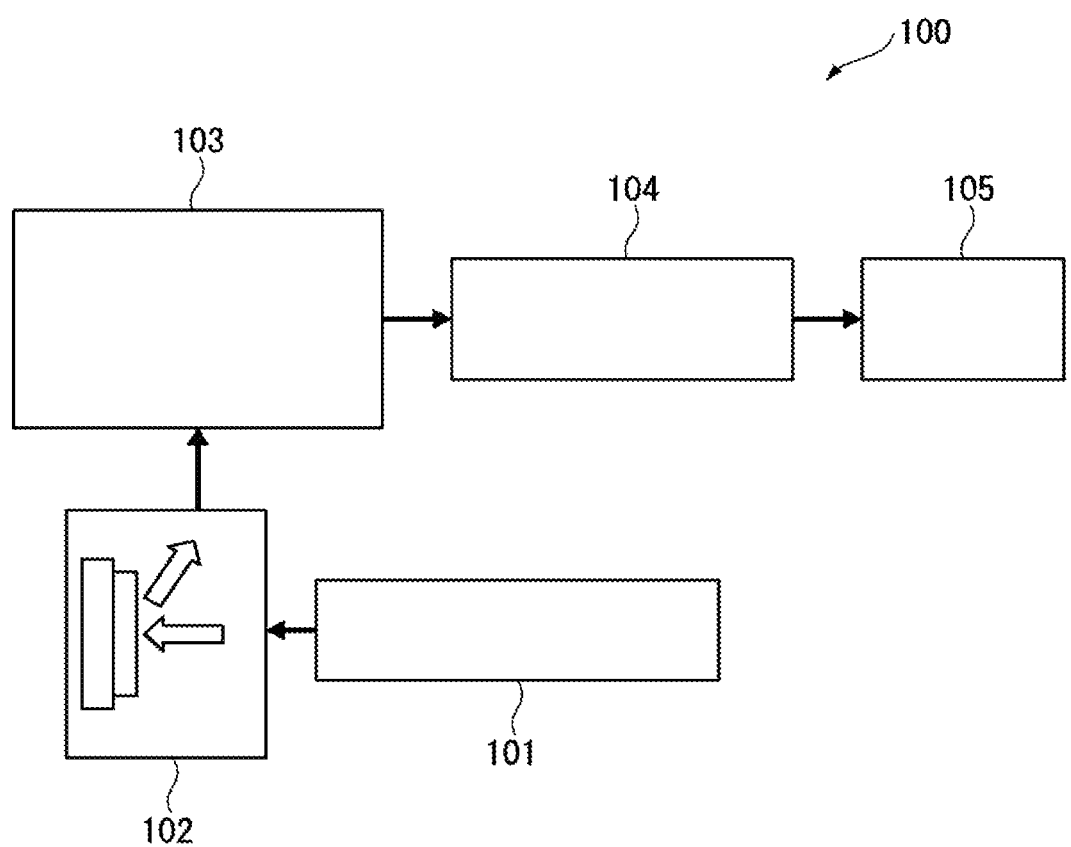
FIG. 2 schematically shows a device for measuring transient PL.

FIG. 2 schematically shows an exemplary device for measuring transient PL.

A transient PL measuring device 100 of the first exemplary embodiment includes: a pulse laser 101 capable of emitting light with a predetermined wavelength; a sample chamber 102 configured to house a measurement sample; a spectrometer 103 configured to disperse light emitted from the measurement sample; a streak camera 104 configured to form a two-dimensional image; and a personal computer 105 configured to analyze the two-dimensional image imported thereinto. It should be noted that transient PL may be measured by a device different from one described in the first exemplary embodiment.

The sample to be housed in the sample chamber 102 is prepared by forming a thin film, which is made of a matrix material doped with a doping material at a concentration of 12 mass %, on a quartz substrate.

The thus-obtained thin film sample is housed in the sample chamber 102, and is irradiated with a pulse laser emitted from the pulse laser 101 to excite the doping material. The emitted excitation light is taken in a 90-degree direction with respect to the irradiation direction of the excitation light, and is dispersed by the spectrometer 103. A two-dimensional image of the light is formed through the streak camera 104. In the thus-obtained two-dimensional image, an ordinate axis corresponds to time, an abscissa axis corresponds to wavelength, and a bright spot corresponds to luminous intensity. The two-dimensional image is taken at a predetermined time axis, thereby obtaining an emission spectrum with an ordinate axis representing luminous intensity and an abscissa axis representing wavelength. Further, the two-dimensional image is taken at a wavelength axis, thereby obtaining a decay curve (transient PL) with an ordinate axis representing the logarithm of luminous intensity and an abscissa axis representing time.

For instance, a thin film sample A was prepared using a reference compound M1 below as a matrix material and a reference compound DP1 below as a doping material, and transient PL was measured.

[Formula 1]

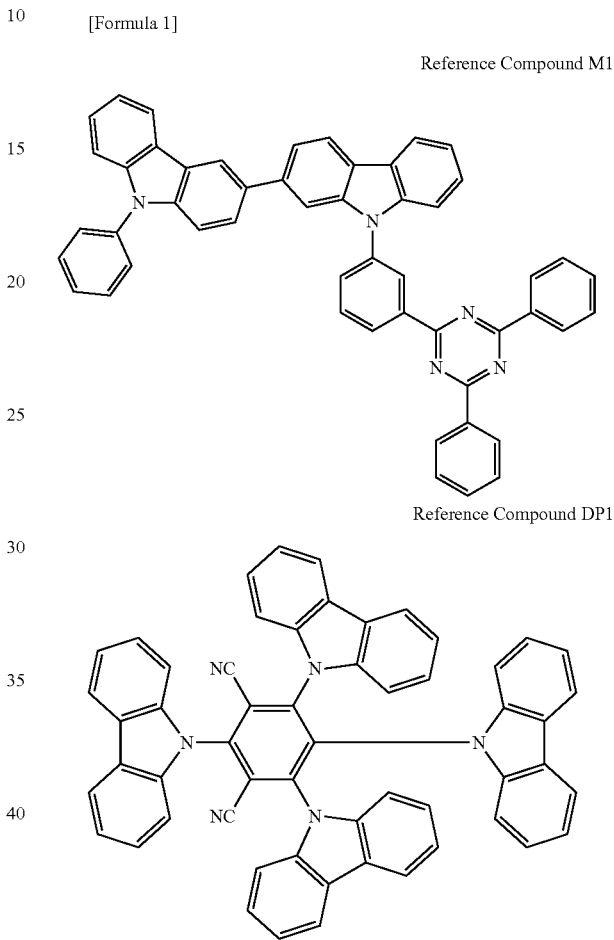

Reference Compound M1

Reference Compound DP1

Respective decay curves of the above thin film sample A and a thin film sample B were analyzed. The thin film sample B was prepared in the same manner as described above using a reference compound M2 below as a matrix material and the reference compound DP1 as a doping material.

Figure 3:
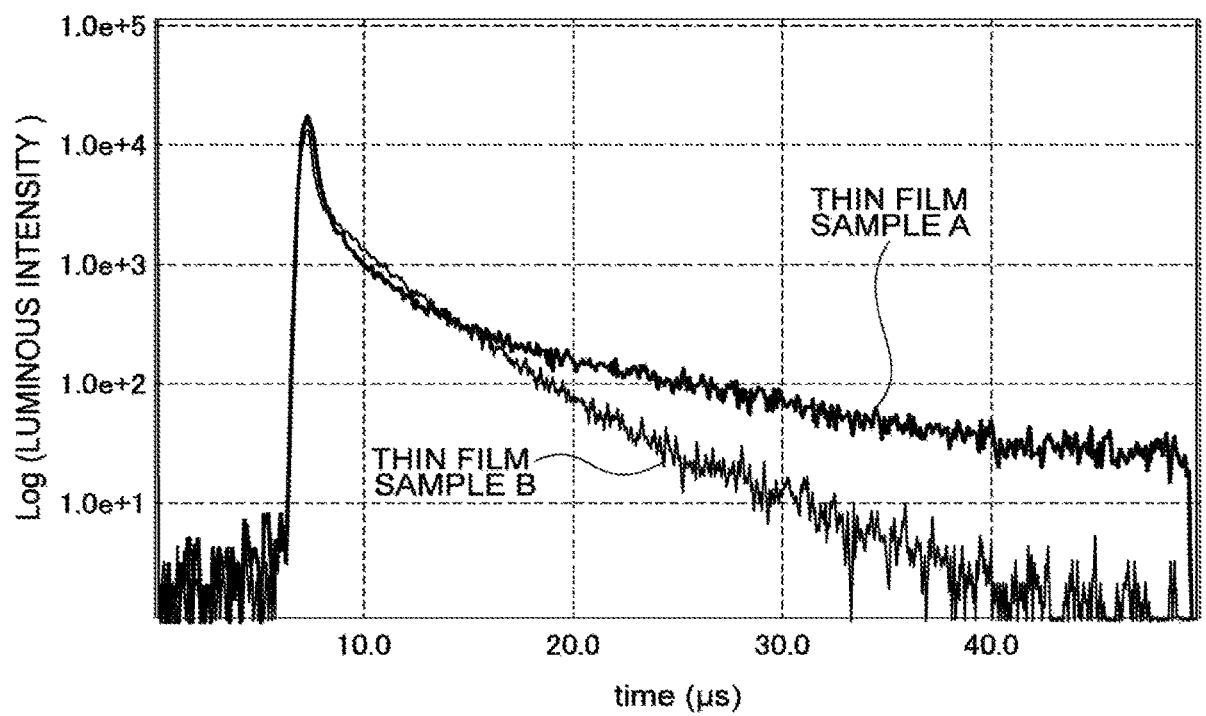
FIG. 3 shows examples of a transient PL decay curve.

FIG. 3 shows a decay curve obtained from transient PL measured using each of the thin film samples A and B.

[Formula 2]

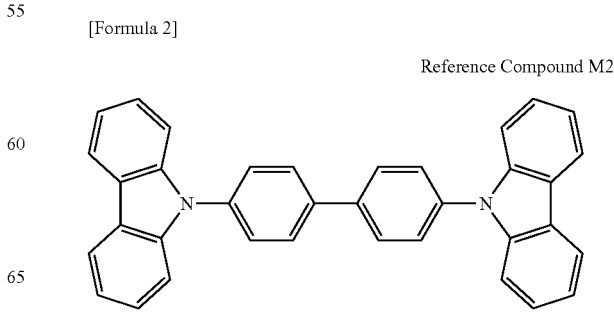

Reference Compound M2

As described above, an emission decay curve with an ordinate axis representing luminous intensity and an abscissa axis representing time can be obtained by the transient PL measurement. Based on the emission decay curve, a fluorescence intensity ratio between fluorescence emitted from a singlet state generated by photo-excitation and delayed fluorescence emitted from a singlet state generated by inverse energy transfer via a triplet state can be estimated. In a delayed fluorescent material, a ratio of the intensity of the slowly decaying delayed fluorescence to the intensity of the promptly decaying fluorescence is relatively large.

In the first exemplary embodiment, the luminescence amount of the delayed fluorescence can be obtained using the device shown in FIG. 2. Emission from the delayed fluorescent compound include: Prompt emission observed immediately when the excited state is achieved by exciting the delayed fluorescent compound with a pulse beam (i.e., a beam emitted from a pulse laser) having an absorbable wavelength; and Delayed emission observed not immediately when but after the excited state is achieved. In the first exemplary embodiment, the amount of Delayed emission is preferably 5% or more relative to the amount of Prompt emission. Specifically, when the amount of Prompt emission is denoted by $X_P$ and the amount of Delayed emission is denoted by $X_D$, a value of $X_D/X_P$ is preferably 0.05 or more.

The amount of Prompt emission and the amount of Delayed emission can be obtained in the same method as a method described in "Nature 492, 234-238, 2012." The amount of Prompt emission and the amount of Delayed emission may be calculated using a device different from one described in the above Literature.

For instance, a sample usable for measuring the delayed fluorescence may be prepared by co-depositing the delayed fluorescent compound and a compound TH-2 below on a quartz substrate at a ratio of the delayed fluorescent compound being 12 mass % to form a 100-nm-thick thin film.

[Formula 3]

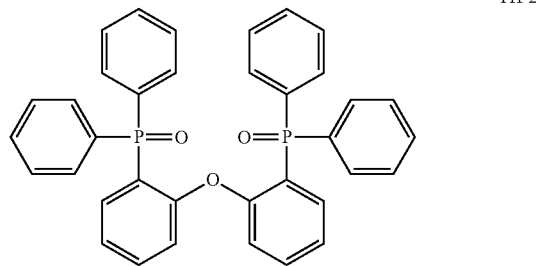

TH-2

TADF Mechanism

A compound having a small ΔST(DF) is preferably used as the delayed fluorescent compound, whereby inverse intersystem crossing from the triplet energy level of the delayed fluorescent compound to the singlet energy level thereof is easily caused by heat energy given from the outside. An energy state conversion mechanism to perform spin exchange from the triplet state of electrically excited excitons within the organic EL device to the singlet state by inverse intersystem crossing is referred to as a TADF mechanism. A difference between the lowest singlet state $S_1$ and the lowest triplet state $T_1$ is defined as ΔST.

In the first exemplary embodiment, each of the second emitting layer 25 of the second pixel 20 and the third emitting layer 35 of the third pixel 30 contains the delayed fluorescent compound and the fluorescent compound. When the compound having a small ΔST(DF) is used as the delayed fluorescent compound, inverse intersystem crossing from the lowest triplet state $T_1$(DF) to the lowest singlet state $S_1$(DF) can be caused by a heat energy. Then, the lowest singlet state $S_1$(FL) of the fluorescent compound is generated by Förster energy transfer from the lowest singlet state $S_1$(DF) of the delayed fluorescent compound. As a result, fluorescence from the lowest singlet state $S_1$(FL) of the fluorescent compound can be observed.

In the first exemplary embodiment, the second emitting layer 25 of the second pixel 20 contains the delayed fluorescent second compound and the fluorescent fifth compound. Accordingly, the lowest singlet state $S_1$(M5) of the fluorescent fifth compound is generated by Förster energy transfer from the lowest singlet state $S_1$(M2) of the delayed fluorescent compound. As a result, fluorescence from the lowest singlet state $S_1$(M5) of the fluorescent fifth compound can be observed.

In the second emitting layer 25, the second compound, the fifth compound, and the sixth compound preferably satisfy a relationship below.

A singlet energy $S1(G_{DF})$ of the second compound and a singlet energy $S1(G_{DP})$ of the fifth compound preferably satisfy a relationship of $S1(G_{DF})>S1(G_{DP})$.

The singlet energy $S1(G_{DF})$ of the second compound and a singlet energy $S1(G_{DS})$ of the sixth compound preferably satisfy a relationship of $S1(G_{DS})>S1(G_{DF})$.

In the second emitting layer 25, a relationship of $S1(G_{DS})>S1(G_{DF})>S1(G_{DP})$ is preferably satisfied.

In the first exemplary embodiment, the third emitting layer 35 of the third pixel 30 contains the delayed fluorescent seventh compound and the fluorescent eighth compound. Accordingly, the lowest singlet state $S_1$(M8) of the fluorescent eighth compound is generated by Förster energy transfer from the lowest singlet state $S_1$(M7) of the delayed fluorescent seventh compound. As a result, fluorescence from the lowest singlet state $S_1$(M8) of the fluorescent eighth compound can be observed.

In the third emitting layer 35, the seventh compound, the eighth compound, and the ninth compound preferably satisfy a relationship below.

A singlet energy $S1(R_{DF})$ of the seventh compound and a singlet energy $S1(R_{DP})$ of the eighth compound preferably satisfy a relationship of $S1(R_{DF})>S1(R_{DP})$.

The singlet energy $S1(R_{DF})$ of the seventh compound and a singlet energy $S1(R_{DS})$ of the ninth compound preferably satisfy a relationship of $S1(R_{DS})>S1(R_{DF})$.

In the third emitting layer 35, a relationship of $S1(R_{DS})>S1(R_{DF})>S1(R_{DP})$ is preferably satisfied.

As shown in the exemplary embodiment, since each pixel does not include a phosphorescent layer but include the fluorescent layer (i.e., the first emitting layer 15) or the emitting layer also containing the delayed fluorescent compound (i.e., the second emitting layer 25 and the third emitting layer 35), a variety of choices of compounds usable for the common layer 50 extending across a plurality of pixels to be shared by the pixels can be given and a lifetime of the organic EL apparatus 1 can be prolonged. Further, also in the organic EL apparatus 1 having a plurality of pixels exhibiting different colors (in red, green and blue), since it is only necessary to provide the common layer 50 extending across the pixels to be shared by the pixels, the arrangement and the manufacturing process of the organic EL apparatus 1 can be simplified.

An organic EL apparatus including a phosphorescent layer as the emitting layer of each pixel has been typically proposed. In such an organic EL apparatus, in order to achieve an efficient emission from the phosphorescent layer, choices for compounds usable for the common layer are limited to some extent. This is because, when a compound used in the common layer does not satisfy a specific condition, triplet excitons generated inside the phosphorescent layer move (leak) to the common layer before exhibiting phosphorescence, leading to a decrease in the luminous efficiency of the phosphorescent layer. Accordingly, for instance, in the organic EL device of Patent Literature 1, a material satisfying a condition that an affinity difference between the material and a host of the green phosphorescent layer is 0.4 eV or less is used for forming the electron transporting layer corresponding to the common layer. As thus described, in order to prevent the decrease in the luminous efficiency of the organic EL apparatus including the phosphorescent layer, it has been required to use a specific material satisfying the condition described in Patent Literature 1.

In contrast, according to the organic EL apparatus 1, each of the second emitting layer 25 and the third emitting layer 35 is not a phosphorescent layer but the emitting layer containing the delayed fluorescent compound, specifically, an emitting layer with use of a TADF mechanism different from an emission mechanism of the phosphorescent layer. Accordingly, the condition required for using the phosphorescent layer is not imposed and the limitation of the choices for the compounds usable for the common layer can be eased. Further, in the organic EL apparatus 1, the second emitting layer 25 and the third emitting layer 35 each contain the fluorescent compound, and the fluorescent compound of each emitting layer mainly emits light. The fluorescent compound exhibits a higher durability than that of a phosphorescent metal complex contained in the phosphorescent layer. Accordingly, the lifetime of the organic EL apparatus 1 in the exemplary embodiment can be prolonged as compared with an organic EL apparatus including the phosphorescent layer.

Moreover, a drive voltage of the organic EL apparatus 1 can be reduced as compared with the organic EL apparatus including the phosphorescent layer. This is because an energy required for exciting a delayed fluorescent compound is considered to be smaller than an energy required for exciting the material contained in the phosphorescent layer.

Each of the second emitting layer 25 and the third emitting layer 35 in the organic EL apparatus 1 contains the fluorescent compound. Since an absorbance coefficient of the fluorescent compound is higher than those of the delayed fluorescent compound and the phosphorescent compound, the efficiency of the Förster energy transfer is improved and the fluorescent compound is likely to receive energy from the delayed fluorescent compound. Accordingly, the organic EL apparatus 1 is more preferable in order to improve the luminous efficiency.

Relationship Between Triplet Energy and Energy Gap at 77 [K]

Description will be made on a relationship between a triplet energy and an energy gap at 77 [K]. In the first exemplary embodiment, the energy gap at 77 [K] is different from a typically defined triplet energy in some aspects.

The triplet energy is measured as follows. Firstly, a target compound for measurement is dissolved in an appropriate solvent to prepare a solution and the solution is encapsulated in a quartz glass tube to prepare a sample. A phosphorescent spectrum (ordinate axis: phosphorescent luminous intensity, abscissa axis: wavelength) of the sample is measured at a low temperature (77K). A tangent is drawn to a rise of the phosphorescent spectrum on the short-wavelength side. The triplet energy is calculated by a predetermined conversion equation based on a wavelength value at an intersection of the tangent and the abscissa axis.

The delayed fluorescent compound usable in the first exemplary embodiment is preferably a compound having a small $\Delta ST$. When $\Delta ST$ is small, intersystem crossing and inverse intersystem crossing are likely to occur even at a low temperature (77K), so that the singlet state and the triplet state coexist. As a result, the spectrum to be measured in the same manner as the above includes emission from both the singlet state and the triplet state. Although it is difficult to distinguish the emission from the singlet state from the emission from the triplet state, the value of the triplet energy is basically considered dominant.

Accordingly, in the first exemplary embodiment, the triplet energy is measured by the same method as a typical triplet energy T, but a value measured in the following manner is referred to as an energy gap $T_{77K}$ in order to differentiate the measured energy from the typical triplet energy in a strict meaning.

The measurement target compound is dissolved in EPA (diethyl ether isopentane:ethanol=5:5:2 (by volume ratio)) such that a concentration of the compound becomes 10 μmol/L. The obtained solution is put into a quartz cell to provide a measurement sample.

A phosphorescent spectrum (ordinate axis: phosphorescent luminous intensity, abscissa axis: wavelength) of the sample is measured at a low temperature (77K). A tangent is drawn to a rise of the phosphorescent spectrum on the short-wavelength side. An energy amount is calculated as an energy gap $T_{77K}$ at 77[K] by the following conversion equation based on a wavelength value $\lambda_{edge}$[nm] at an intersection of the tangent and the abscissa axis.

$$T_{77K} [eV] = 1239.85/\lambda_{edge} \quad \text{Conversion Equation (F1):}$$

The tangent to the rise of the phosphorescence spectrum on the short-wavelength side is drawn as follows. While moving on a curve of the phosphorescence spectrum from the short-wavelength side to the maximum spectral value closest to the short-wavelength side among the maximum spectral values, a tangent is checked at each point on the curve toward the long-wavelength of the phosphorescence spectrum. An inclination of the tangent was increased as the curve rises (i.e., a value of the ordinate axis is increased). A tangent drawn at a point of the maximum inclination (i.e., a tangent at an inflection point) is defined as the tangent to the rise of the phosphorescence spectrum on the short-wavelength side.

The maximum with peak intensity being 15% or less of the maximum peak intensity of the spectrum is not included in the above-mentioned maximum closest to the short-wavelength side of the spectrum. The tangent drawn at a point of the maximum spectral value being closest to the short-wavelength side and having the maximum inclination is defined as a tangent to the rise of the phosphorescence spectrum on the short-wavelength side.

For phosphorescence measurement, a spectrophotofluorometer body F-4500 (manufactured by Hitachi High-Technologies Corporation) is usable. The measurement instrument is not limited to this arrangement. A combination of a cooling unit, a low temperature container, an excitation light source and a light-receiving unit may be used for measurement.

Singlet Energy S1

The singlet energy S1 is measured as follows.

A target compound to be measured is deposited to form a 100-nm thick film on a quartz substrate to prepare a sample. An emission spectrum of the sample is measured at a normal temperature (300K), the spectrum being expressed in coordinates of which the ordinate axis indicates luminous intensity and of which the abscissa axis indicates the wavelength. A tangent is drawn to the rise of the emission spectrum on the short-wavelength side, and a wavelength value $\lambda_{edge}$ [nm] at an intersection of the tangent and the abscissa axis is obtained. The singlet energy S1 is calculated from the following conversion equation (F2) based on the wavelength value.

$$S1 [eV]=1239.85/\lambda_{edge} \qquad \text{Conversion Equation (F2):}$$

Absorption spectrum is measured using a spectrophotometer. For instance, a spectrophotometer (device name: U3310 manufactured by Hitachi, Ltd.) is usable.

The tangent to the rise of the emission spectrum on the short-wavelength side is drawn as follows. While moving on a curve of the emission spectrum from the short-wavelength side to the maximum spectral value closest to the short-wavelength side among the maximum spectral values, a tangent is checked at each point on the curve toward the long-wavelength of the emission spectrum. An inclination of the tangent is increased as the curve rises (i.e., a value of the ordinate axis is increased). A tangent drawn at a point of the maximum inclination (i.e., a tangent at an inflection point) is defined as the tangent to the rise of the emission spectrum on the short-wavelength side.

The maximum with peak intensity being 15% or less of the maximum peak intensity of the spectrum is not included in the above-mentioned maximum closest to the short-wavelength side of the spectrum. The tangent drawn at a point of the maximum spectral value being closest to the short-wavelength side and having the maximum inclination is defined as a tangent to the rise of the emission spectrum on the short-wavelength side.

It should be noted that, when the measurement results using the sample deposited on the quartz is significantly different from the measurement results using the solution, such a difference is assumed to be caused by formation of molecular aggregate, a strong correlation with a solvent, and the like. For this reason, the above measurement may be conducted using a sample obtained by co-depositing on a quartz substrate the measurement target compound and another appropriate material having a large energy gap and forming no exciplex.

The delayed fluorescent compound in the exemplary embodiment is represented by, for instance, a formula (1) below.

[Formula 4]

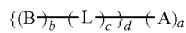
(1)

In the formula (1), A is a group having a partial structure selected from formulae (a-1) to (a-7) below. When a plurality of A are present, the plurality of A are mutually the same or different, and are bonded to each other to form a saturated or unsaturated ring or are not bonded.

B is a group having a partial structure selected from formulae (b-1) to (b-6) below. When a plurality of B are present, the plurality of B are mutually the same or different, and are bonded to each other to form a saturated or unsaturated ring or are not bonded.

a, b and d are each independently an integer of 1 to 5.

c is an integer of 0 to 5.

When c is 0, A is bonded to B by a single bond or a spiro bond.

When c is an integer of 1 to 5, L is a linking group selected from the group consisting of a substituted or unsubstituted aromatic hydrocarbon group having 6 to 30 ring carbon atoms and a substituted or unsubstituted heterocyclic group having 5 to 30 ring atoms.

When a plurality of L are present, the plurality of L are mutually the same or different, and are bonded to each other to form a saturated or unsaturated ring or are not bonded.

[Formula 5]

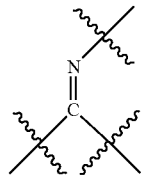
(a-1)

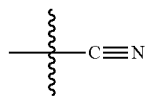
(a-2)

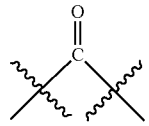
(a-3)

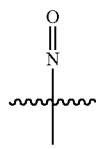
(a-4)

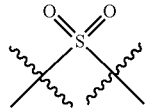
(a-5)

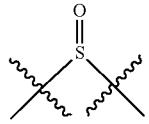
(a-6)

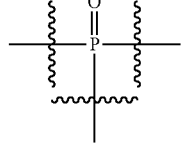
(a-7)

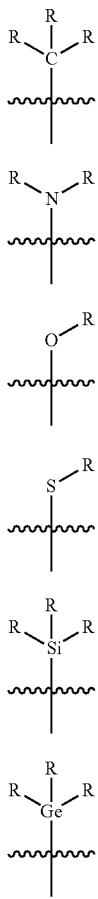

In the formulae (b-1) to (b-6), R is each independently a hydrogen atom or a substituent.

R serving as the substituent is selected from the group consisting of a substituted or unsubstituted aromatic hydrocarbon group having 6 to 30 ring carbon atoms, a substituted or unsubstituted heterocyclic group having 5 to 30 ring atoms, and a substituted or unsubstituted alkyl group having 1 to 30 carbon atoms. When a plurality of R are present, the plurality of R are mutually the same or different, and are bonded to each other to form a saturated or unsaturated ring or are not bonded.

The group having the partial structure selected from the formulae (a-1) to (a-7) is exemplified by a group represented by a formula (a-3-1) below, which is a group having the partial structure of the formula (a-3).

[Formula 7]

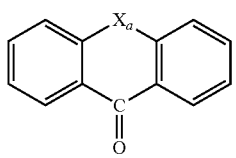

(a-3-1)

In the formula (a-3-1), $X_a$ is a single bond, an oxygen atom, a sulfur atom, or a carbon atom bonded to L or B in the formula (1).

The group having the partial structure selected from the formulae (b-1) to (b-6) is exemplified by a group represented by a formula (b-2-1) below, which is a group having the partial structure of the formula (b-2).

[Formula 8]

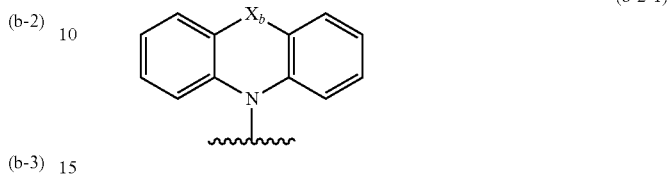

(b-2-1)

In the formula (b-2-1), $X_b$ is a single bond, an oxygen atom, a sulfur atom, $CR_{b1}R_{b2}$ or a carbon atom bonded to L or A in the formula (1).

$R_{b1}$ and $R_{b2}$ are each independently a hydrogen atom or a substituent. $R_{b1}$ and $R_{b2}$ serving as the substituent are each independently selected from the group consisting of a substituted or unsubstituted alkyl group having 1 to 30 carbon atoms and a substituted or unsubstituted aromatic hydrocarbon group having 6 to 30 ring carbon atoms.

$R_{b1}$ and $R_{b2}$ are preferably a substituent selected from the group consisting of a substituted or unsubstituted alkyl group having 1 to 30 carbon atoms and a substituted or unsubstituted aromatic hydrocarbon group having 6 to 30 ring carbon atoms, more preferably a substituent selected from the group consisting of a substituted or unsubstituted alkyl group having 1 to 30 carbon atoms.

Examples of a bonding pattern of the compound represented by the formula (1) are shown in Table 1 below.

TABLE 1

| No. | a | b | c | d | Bonding Pattern |
|---|---|---|---|---|---|
| (1A) | 1 | 1 | 0 | 1 | B—A |
| (1B) | 1 | 1 | 1 | 1 | B—L—A |
| (1C) | 2 | 1 | 0 | 1 | B—A—A, B⟨A/A |
| (1D) | 1 | 2 | 0 | 1 | B—B—A, B\B/A |
| (1E) | 2 | 1 | 1 | 1 | B—L—A—A, B—L⟨A/A |
| (1F) | 1 | 2 | 1 | 1 | B—B—L—A, B\B/L—A |
| (1G) | 1 | 1 | 2 | 1 | B—L—L—A |
| (1H) | 1 | 1 | 1 | 2 | B—L\A/, B—L/ |
|  |  |  |  |  | B—L—B—L—A |

In the exemplary embodiment, B in the formula (1) is preferably represented by a formula (100) below.

[Formula 9]

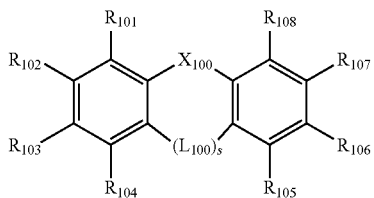

(100)

In the formula (100), $R_{101}$ to $R_{108}$ are each independently a hydrogen atom or a substituent.

$R_{101}$ to $R_{106}$ serving as the substituent are each independently selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted silyl group, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, <<nret>> a substituted or unsubstituted arylamino group having 6 to 60 ring carbon atoms, a substituted or unsubstituted alkylthio group having 1 to 30 carbon atoms, and a substituted or unsubstituted arylthio group having 6 to 30 ring carbon atoms.

Any one of a combination of $R_{101}$ and $R_{102}$, a combination of $R_{102}$ and $R_{103}$, a combination of $R_{103}$ and $R_{104}$, a combination of $R_{105}$ and $R_{106}$, a combination of $R_{106}$ and $R_{107}$, and a combination of $R_{107}$ and $R_{108}$ forms a saturated or unsaturated ring structure, or none of those forms a ring.

$L_{100}$ is a linking group represented by any one selected from formulae (111) to (117).

s is an integer of 1 to 3. When s is 2 or 3, a plurality of $L_{100}$ are mutually the same or different.

$X_{100}$ is a linking group represented by any one selected from formulae (121) to (125).

[Formula 10]

 (111)

 (112)

 (113)

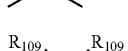 (114)

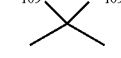 (115)

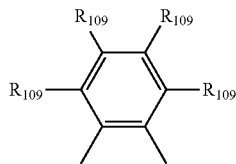 (116)

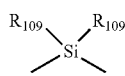 (117)

In the formulae (113) to (117), $R^{109}$ each independently represents the same as $R_{101}$ to $R_{108}$ in the formula (100).

One of $R_{101}$ to $R_{108}$ in the formula (100) or one of $R_{109}$ is a single bond to be bonded to L or A in the formula (1).

$R_{109}$ is bonded to $R_{104}$ or $R_{105}$ in the formula (100) to form a saturated or unsaturated ring structure, or is not bonded thereto.

When a plurality of $R_{109}$ are present, the plurality of $R_{109}$ are mutually the same or different.

[Formula 11]

 (121)

 (122)

 (123)

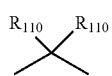 (124)

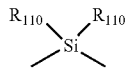 (125)

In the formulae (123) to (125), $R_{110}$ is each independently a hydrogen atom or a substituent.

$R_{110}$ serving as the substituent is selected from the group consisting of a substituted or unsubstituted aromatic hydrocarbon group having 6 to 30 ring carbon atoms, a substituted or unsubstituted heterocyclic group having 5 to 30 ring atoms, and a substituted or unsubstituted alkyl group having 1 to 30 carbon atoms. When a plurality of $R_{110}$ are present, the plurality of $R_{110}$ are mutually the same or different.

$R_{110}$ is bonded to $R_{101}$ or $R_{108}$ in the formula (100) to form a saturated or unsaturated ring structure, or is not bonded thereto.

In the exemplary embodiment, $L_{100}$ is preferably represented by any one of the formulae (111) to (114), more preferably represented by the formula (113) or (114).

In the exemplary embodiment, $X_{100}$ is preferably represented by any one of the formulae (121) to (124), more preferably represented by the formula (123) or (124).

The compound represented by the formula (1) is exemplified by a compound represented by a formula (10).

[Formula 12]

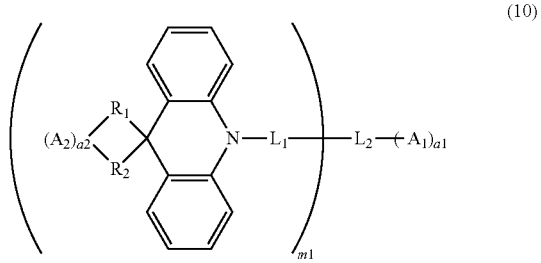

(10)

In the formula (10), a1 is 0 or 1, a2 is 0 or 1, and a1+a2≥1. m is an integer of 1 to 5.

When a2 is 0, $R_1$ and $R_2$ are each independently a hydrogen atom or a monovalent substituent. $R_1$ and $R_2$ serving as the substituent are each independently selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group.

When a2 is 1, $R_1$ and $R_2$ are each independently a linking group selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group.

When m1 is 2 or more, a plurality of $R_1$ are mutually the same or different, and a plurality of $R_2$ are mutually the same or different.

$A_1$ and $A_2$ are each independently the group having the partial structure selected from the formulae (a-1) to (a-7). When m1 is 2 or more, a plurality of $A_2$ are mutually the same or different.

When a1 is 0, $L_2$ is a hydrogen atom or a monovalent substituent. $L_2$ serving as the substituent is selected from the group consisting of a substituted or unsubstituted aromatic hydrocarbon group having 6 to 30 ring carbon atoms, and a substituted or unsubstituted heterocyclic group having 5 to 30 ring atoms.

When a1 is 1, $L_2$ is a single bond or a linking group. $L_2$ serving as the linking group is selected from the group consisting of a substituted or unsubstituted aromatic hydrocarbon group having 6 to 30 ring carbon atoms and a substituted or unsubstituted heterocyclic group having 5 to 30 ring atoms.

$L_1$ is a single bond or a linking group. $L_1$ serving as the linking group is selected from the group consisting of a substituted or unsubstituted aromatic hydrocarbon group having 6 to 30 ring carbon atoms and a substituted or unsubstituted heterocyclic group having 5 to 30 ring atoms. When m1 is 2 or more, a plurality of $L_1$ are mutually the same or different.

In the exemplary embodiment, when a2 is 0, $R_1$ and $R_2$ are preferably a substituent selected from the group consisting of a substituted or unsubstituted aromatic hydrocarbon group having 6 to 30 ring carbon atoms, a substituted or unsubstituted heterocyclic group having 5 to 30 ring atoms and a substituted silyl group, more preferably a substituent selected from the group consisting of a substituted or unsubstituted aromatic hydrocarbon group having 6 to 30 ring carbon atoms and a substituted or unsubstituted heterocyclic group having 5 to 30 ring atoms.

In the exemplary embodiment, when a2 is 1, $R_1$ and $R_2$ are preferably a linking group selected from the group consisting of a substituted or unsubstituted aromatic hydrocarbon group having 6 to 30 ring carbon atoms, a substituted or unsubstituted heterocyclic group having 5 to 30 ring atoms and a substituted silyl group, more preferably a linking group selected from the group consisting of a substituted or unsubstituted aromatic hydrocarbon group having 6 to 30 ring carbon atoms and a substituted or unsubstituted heterocyclic group having 5 to 30 ring atoms.

Moreover, the compound represented by the formula (1) is exemplified by a compound represented by a formula (10') below.

[Formula 13]

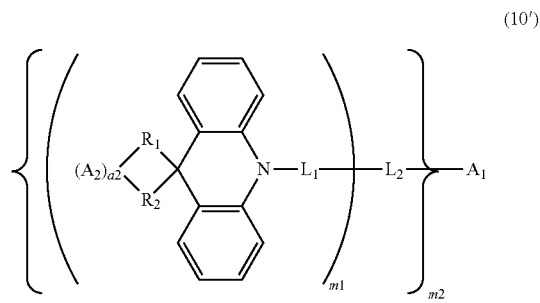

(10')

In the formula (10'), m2 is 2.

a2 is 0 or 1. A plurality of a2 are mutually the same or different.

m1 is an integer of 1 to 5. A plurality of m1 are mutually the same or different.

When a2 is 0, $R_1$ and $R_2$ are each independently a hydrogen atom or a monovalent substituent. $R_1$ and $R_2$ serving as the substituent are each independently selected from the group consisting of <<nret>> a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group.

When a2 is 1, $R_1$ and $R_2$ are each independently a linking group selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, and a substituted silyl group.

A plurality of $R_1$ are mutually the same or different. A plurality of $R_2$ are mutually the same or different.

$A_1$ and $A_2$ are each independently the group having the partial structure selected from the formulae (a-1) to (a-7). A plurality of $A_2$ are mutually the same or different.

$L_2$ is a single bond or a linking group. $L_2$ serving as the linking group is selected from the group consisting of a substituted or unsubstituted aromatic hydrocarbon group having 6 to 30 ring carbon atoms and a substituted or unsubstituted heterocyclic group having 5 to 30 ring atoms. A plurality of $L_2$ are mutually the same or different.

$L_1$ is a single bond or a linking group. $L_1$ serving as the linking group is selected from the group consisting of a substituted or unsubstituted aromatic hydrocarbon group having 6 to 30 ring carbon atoms and a substituted or unsubstituted heterocyclic group having 5 to 30 ring atoms. A plurality of $L_1$ are mutually the same or different.

The compound represented by the formula (10) is exemplified by a compound represented by a formula (10A) below.

[Formula 14]

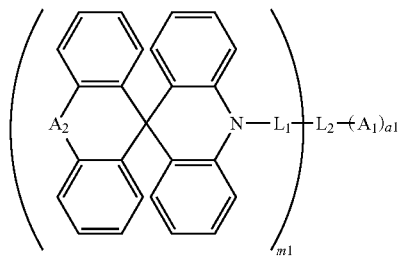
(10A)

In the formula (10A), a1, m1, $A_1$, $A_2$, $L_1$ and $L_2$ respectively represent the same as a1, m1, $A_1$, $A_2$, $L_1$ and $L_2$ in the formula (10).

The compound represented by the formula (10) or the formula (10') is exemplified by compounds represented by formulae (10B) to (10E) below.

[Formula 15]

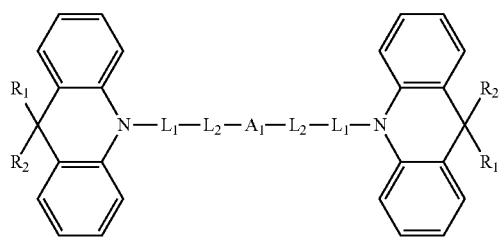
(10B)

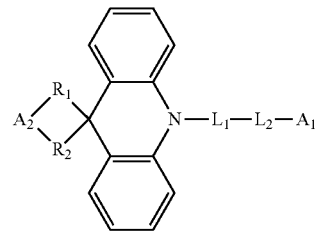
(10C)

[Formula 16]

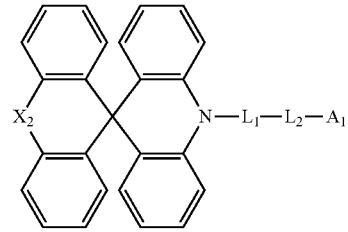
(10D)

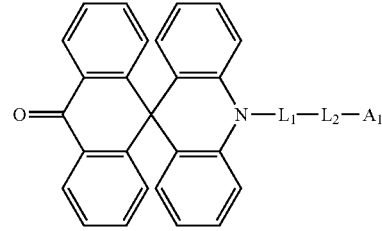
(10E)

In the formula (10D), $X_2$ is selected from the group consisting of $=N-L_1-L_2-A_1$, an oxygen atom, a sulfur atom and a selenium atom. In the formulae (10B), (10C), (10D) and (10E), $R_1$, $R_2$, $A_1$, $A_2$, $L_1$ and $L_2$ respectively represent the same as $R_1$, $R_2$, $A_1$, $A_2$, $L_1$ and $L_2$ in the formula (10).

Specific examples of the delayed fluorescent compound of the exemplary embodiment are shown below. It should be noted that the delayed fluorescent compound according to the invention is not limited to these specific examples.

[Formula 17]

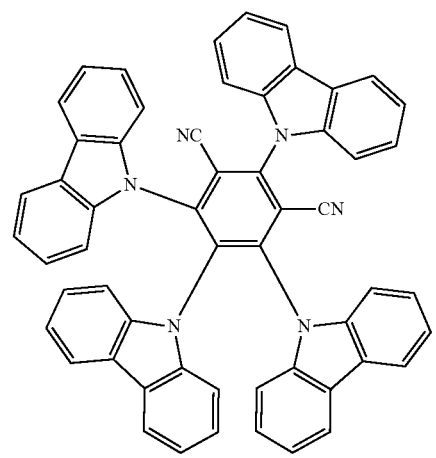

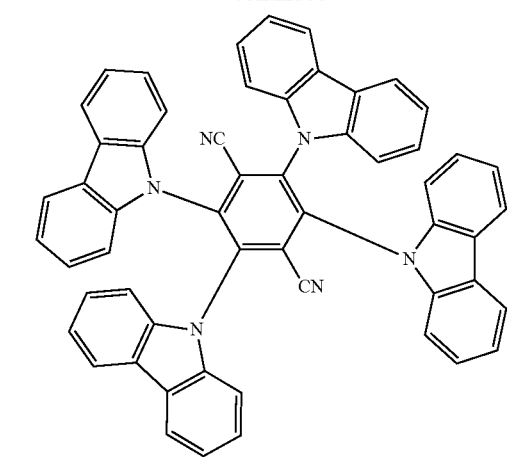
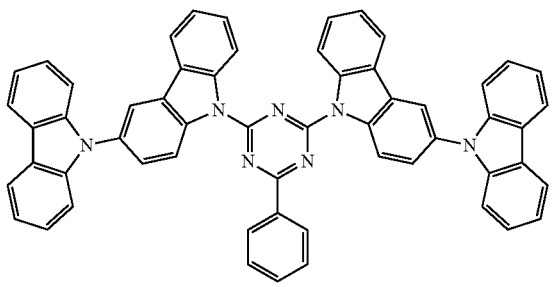
[Formula 18]
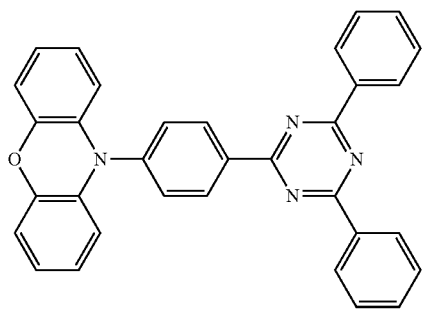
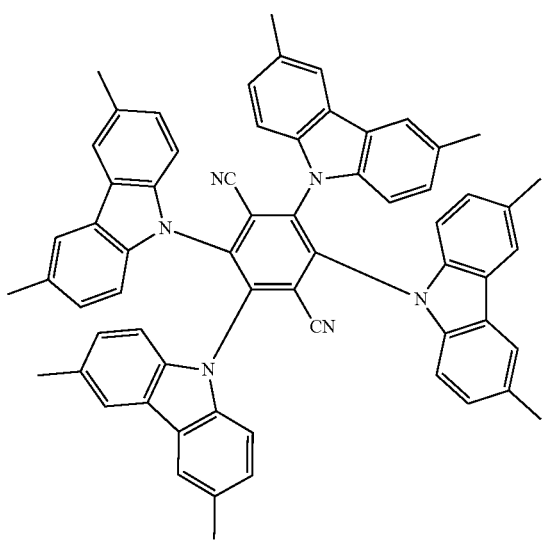
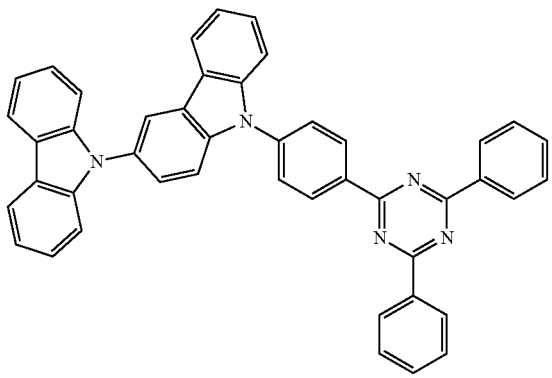
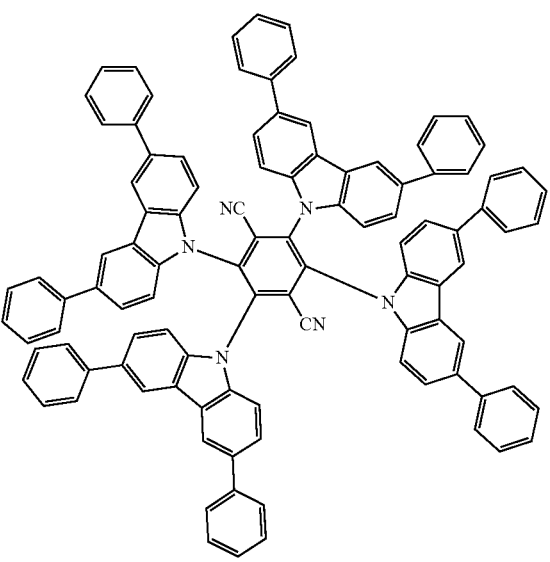
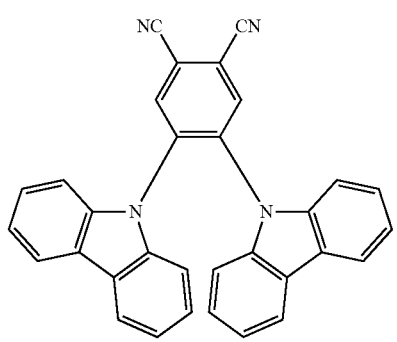

[Formula 19]
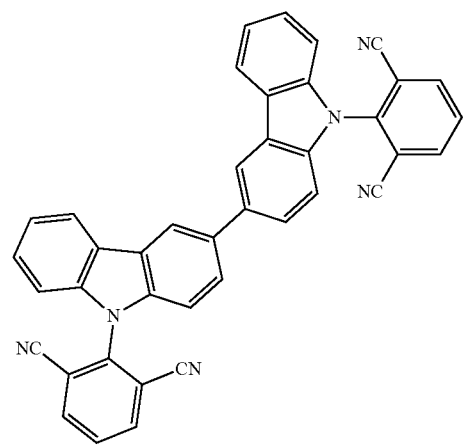
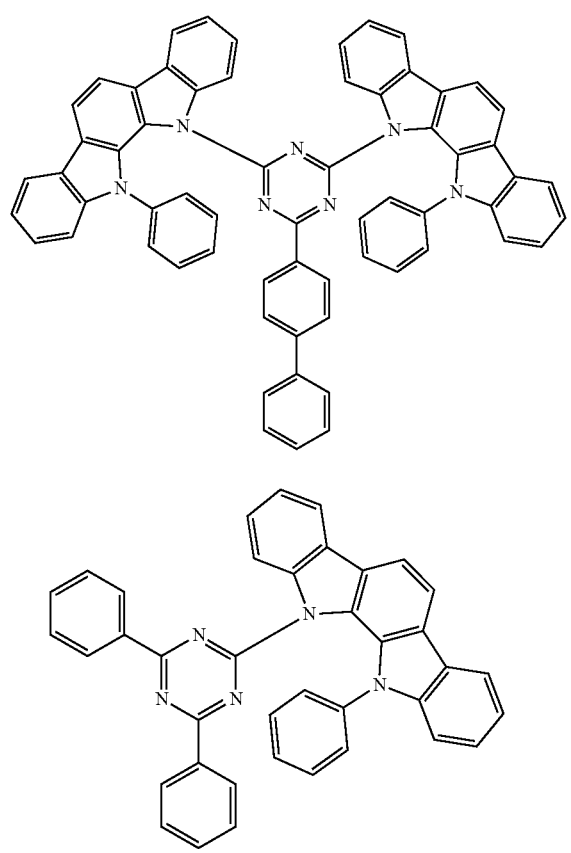
[Formula 20]
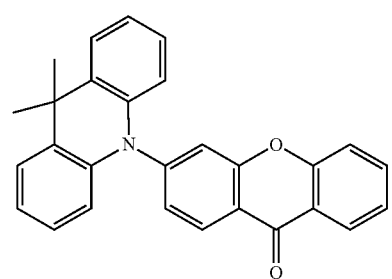

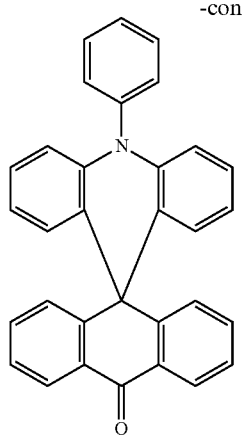
[Formula 21]
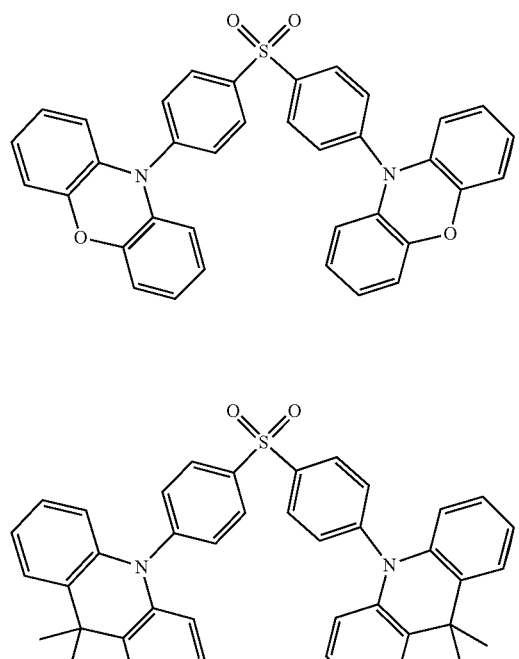
[Formula 22]
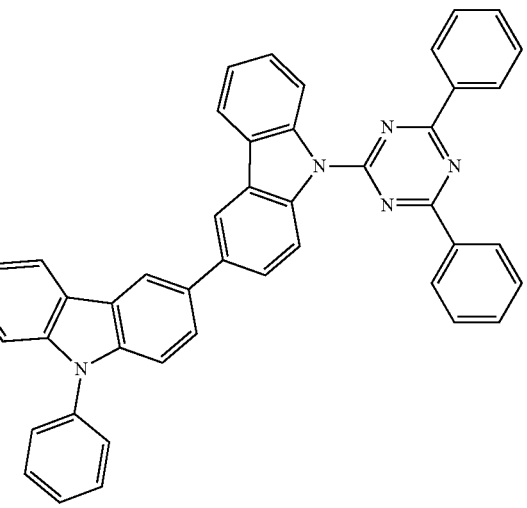
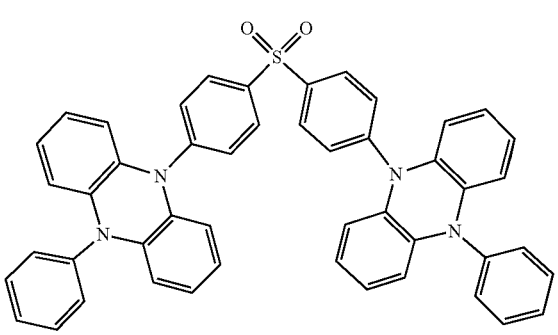
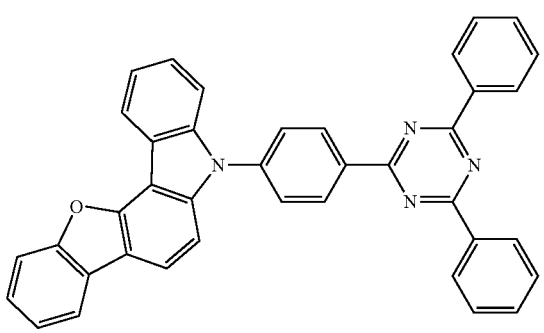

[Formula 23]

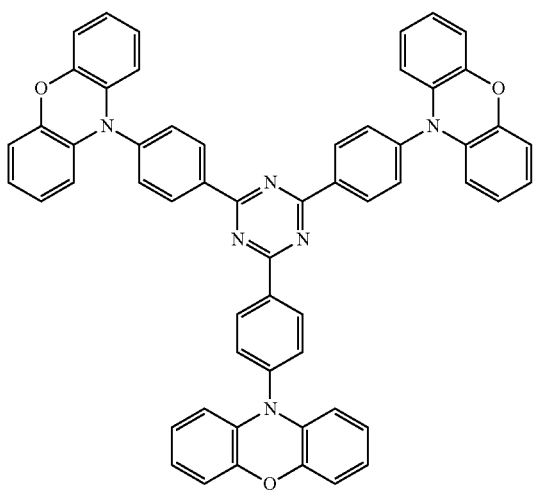

[Formula 24]

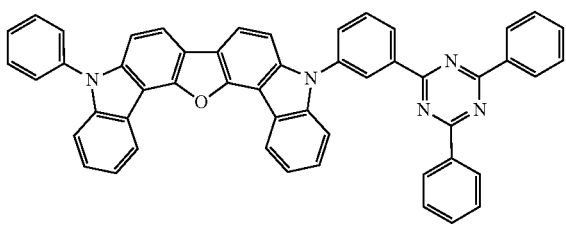

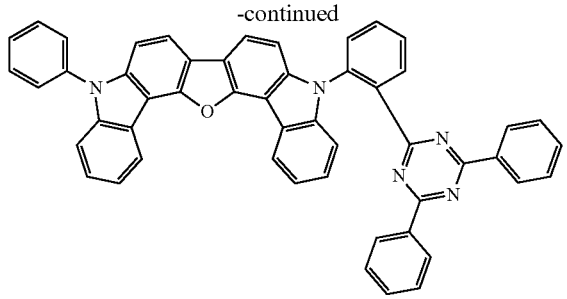

Herein, the number of carbon atoms forming a ring (also referred to as ring carbon atoms) means the number of carbon atoms included in atoms forming the ring itself of a compound in which the atoms are bonded to form the ring (e.g., a monocyclic compound, a fused ring compound, a cross-linked compound, a carbocyclic compound, and a heterocyclic compound). When the ring is substituted by a substituent, carbon atom(s) included in the substituent is not counted as the ring carbon atoms. The same applies to the "ring carbon atoms" described below, unless particularly noted. For instance, a benzene ring has 6 ring carbon atoms, a naphthalene ring has 10 ring carbon atoms, a pyridinyl group has 5 ring carbon atoms, and a furanyl group has 4 ring carbon atoms. When a benzene ring or a naphthalene ring is substituted, for instance, by an alkyl group, the carbon atoms of the alkyl group are not counted as the ring carbon atoms. For instance, when a fluorene ring (inclusive of a spirofluorene ring) is bonded as a substituent to a fluorene ring, the carbon atoms of the fluorene ring as a substituent are not counted as the ring carbon atoms.

Herein, the number of atoms forming a ring (also referred to as ring atoms) means the number of atoms forming the ring itself of a compound in which the atoms are bonded to form the ring (e.g., a monocyclic compound, a fused ring compound, a cross-linked compound, a carbocyclic compound, and a heterocyclic compound). Atom(s) not forming the ring and atom(s) included in the substituent substituting the ring are not counted as the ring atoms. The same applies to the "ring atoms" described below, unless particularly noted. For instance, a pyridine ring has 6 ring atoms, a quinazoline ring has 10 ring atoms, and a furan ring has 5 ring atoms. Hydrogen atoms respectively bonded to carbon atoms of the pyridine ring or the quinazoline ring and atoms forming a substituent are not counted as the ring atoms. For instance, when a fluorene ring (inclusive of a spirofluorene ring) is bonded as a substituent to a fluorene ring, the atoms of the fluorene ring as a substituent are not counted as the ring atoms.

Next, each of substituents described in the above formulae will be described.

Herein, examples of an aryl group (occasionally referred to as an aromatic hydrocarbon group) having 6 to 30 ring carbon atoms include a phenyl group, biphenyl group, terphenyl group, naphthyl group, anthryl group, phenanthryl group, fluorenyl group, pyrenyl group, chrysenyl group, fluoranthenyl group, benz[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

Herein, the aryl group preferably has 6 to 20 ring carbon atoms, more preferably 6 to 14 ring carbon atoms, further preferably 6 to 12 ring carbon atoms. Among the aryl group, a phenyl group, biphenyl group, naphthyl group, phenanthryl group, terphenyl group and fluorenyl group are further more preferable. A carbon atom at a position 9 of each of 1-fluorenyl group, 2-fluorenyl group, 3-fluorenyl group and 4-fluorenyl group is preferably substituted by a substituted or unsubstituted alkyl group having 1 to 30 carbon atoms or a substituted or unsubstituted aryl group having 6 to 18 ring carbon atoms described herein below.

Herein, the heteroaryl group (occasionally referred to as heterocyclic group, heteroaromatic ring group or aromatic heterocyclic group) having 5 to 30 ring atoms preferably contains at least one hetero atom selected from the group consisting of nitrogen, sulfur, oxygen, silicon, selenium atom and germanium atom, and more preferably contains at least one hetero atom selected from the group consisting of nitrogen, sulfur and oxygen. Herein, examples of the heterocyclic group having 5 to 30 ring atoms include a pyridyl group, pyrimidinyl group, pyrazinyl group, pyridazynyl group, triazinyl group, quinolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothienyl group, benzoxazolyl group, benzothiazolyl group, benzisoxazolyl group, benzisothiazolyl group, benzoxadiazolyl group, benzothiadiazolyl group, dibenzofuranyl group, dibenzothienyl group, piperidinyl group, pyrrolidinyl group, piperazinyl group, morpholyl group, phenazinyl group, phenothiazinyl group, and phenoxazinyl group.

Herein, the heterocyclic group preferably has 5 to 20 ring atoms, more preferably 5 to 14 ring atoms. Among the above heterocyclic group, a 1-dibenzofuranyl group, 2-dibenzofuranyl group, 3-dibenzofuranyl group, 4-dibenzofuranyl group, 1-dibenzothienyl group, 2-dibenzothienyl group, 3-dibenzothienyl group, 4-dibenzothienyl group, 1-carbazolyl group, 2-carbazolyl group, 3-carbazolyl group, 4-carbazolyl group, and 9-carbazolyl group are further preferable. A nitrogen atom at a position 9 of each of 1-carbazolyl group, 2-carbazolyl group, 3-carbazolyl group and 4-carbazolyl group is preferably substituted by a substituted or unsubstituted aryl group having 6 to 30 ring carbon atoms or a substituted or unsubstituted heterocyclic group having 5 to 30 ring atoms described herein.

Herein, the heterocyclic group may be a group derived from any one of partial structures represented by formulae (XY-1) to (XY-18).

[Formula 25]

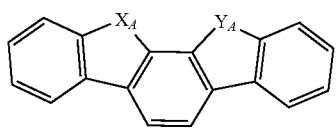
(XY-1)

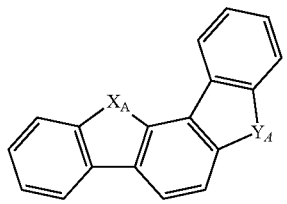
(XY-2)

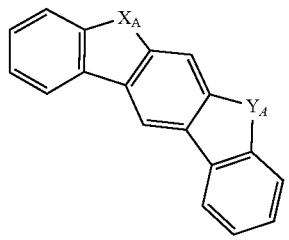
(XY-3)

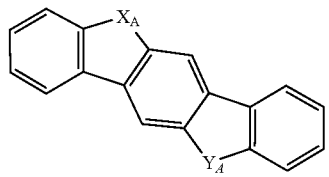
(XY-4)

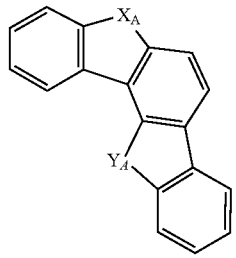
(XY-5)

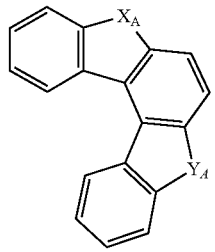
(XY-6)

[Formula 26]

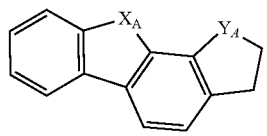
(XY-7)

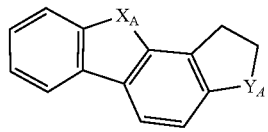
(XY-8)

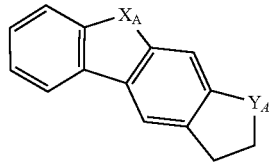
(XY-9)

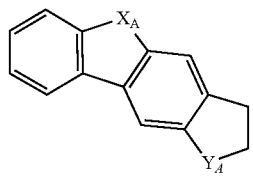
(XY-10)

-continued (XY-11)
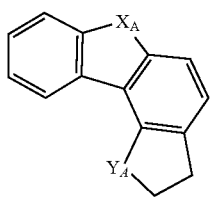

(XY-12)
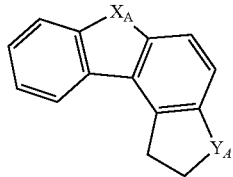

[Formula 27]

(XY-13)
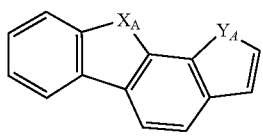

(XY-15)
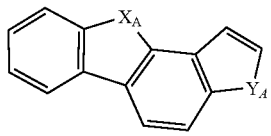

(XY-16)
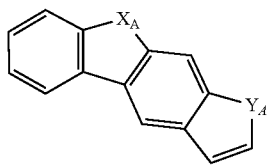

(XY-17)
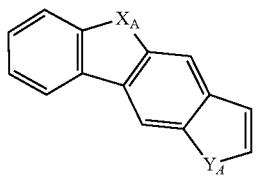

(XY-18)
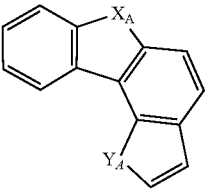

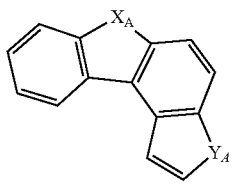

In the formulae (XY-1) to (XY-18), $X_A$ and $Y_A$ are each independently a hetero atom, and are preferably an oxygen atom, sulfur atom, selenium atom, silicon atom or germanium atom. The partial structures represented by the formulae (XY-1) to (XY-18) may each have a bond(s) in any position to become a heterocyclic group, in which the heterocyclic group may be substituted.

Herein, examples of the substituted or unsubstituted carbazolyl group may include a group formed by further fusing a ring(s) to a carbazole ring as shown in the following formulae. Such a group also may be substituted. Bonding positions of the group may be altered as desired.

[Formula 28]

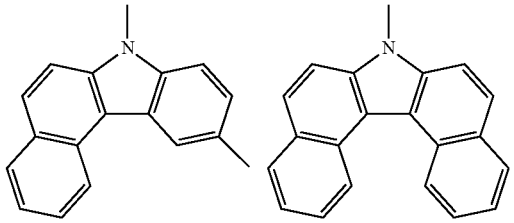

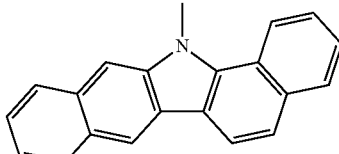

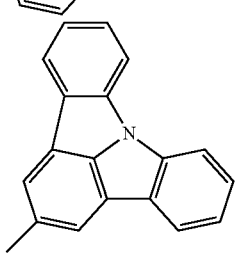

The alkyl group having 1 to 30 carbon atoms herein may be linear, branched or cyclic. Examples of the linear or branched alkyl group include: a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, amyl group, isoamyl group, 1-methylpentyl group, 2-methylpentyl group, 1-pentylhexyl group, 1-butylpentyl group, 1-heptyloctyl group, and 3-methylpentyl group.

Herein, the linear or branched alkyl group preferably has 1 to 10 carbon atoms, more preferably 1 to 6 carbon atoms. Among the linear or branched alkyl group, a methyl group, ethyl group, propyl group, isopropyl group, n-butyl group, s-butyl group, isobutyl group, t-butyl group, n-pentyl group, n-hexyl group, amyl group, isoamyl group and neopentyl group are further preferable.

Herein, examples of the cycloalkyl group having 3 to 30 ring carbon atoms include a cyclopropyl group, cyclobutyl group, cyclopentyl group, cyclohexyl group, 4-metylcyclohexyl group, adamantyl group and norbornyl group. The cycoalkyl group preferably has 3 to 10 ring carbon atoms, more preferably 5 to 8 ring carbon atoms. Among the cycloalkyl group, a cyclopentyl group and a cyclohexyl group are further preferable.

Herein, an alkyl halide group provided by substituting an alkyl group with a halogen atom is exemplified by an alkyl halide group provided by substituting an alkyl group having 1 to 30 carbon atoms with one or more halogen atoms. Specific examples of the above halogenated alkyl group are a fluoromethyl group, difluoromethyl group, trifluoromethyl group, fluoroethyl group, trifluoromethylmethyl group, trifluoroethyl group and pentafluoroethyl group.

Herein, examples of the substituted silyl group include an alkylsilyl group having 3 to 30 carbon atoms and an arylsilyl group having 6 to 30 ring carbon atoms.

Herein, the alkylsilyl group having 3 to 30 carbon atoms is exemplified by a trialkylsilyl group having the above examples of the alkyl group having 1 to 30 carbon atoms. Specific examples of the alkylsilyl group include a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyl dimethylsilyl group, propyldimethylsilyl group, and triisopropylsilyl group. Three alkyl groups in the trialkylsilyl group are mutually the same or different.

Herein, examples of the arylsilyl group having 6 to 30 ring carbon atoms include a dialkylarylsilyl group, alkyldiarylsilyl group and triarylsilyl group.

The dialkylarylsilyl group is exemplified by a dialkylarylsilyl group including two of the alkyl group listed as the examples of the alkyl group having 1 to 30 carbon atoms and one of the aryl group listed as the examples of the aryl group having 6 to 30 ring carbon atoms. The dialkylarylsilyl group preferably has 8 to 30 carbon atoms.

The alkyldiarylsilyl group is exemplified by an alkyldiarylsilyl group including one of the alkyl group listed as the examples of the alkyl group having 1 to 30 carbon atoms and two of the aryl group listed as the examples of the aryl group having 6 to 30 ring carbon atoms. The alkyldiarylsilyl group preferably has 13 to 30 carbon atoms.

The triarylsilyl group is exemplified by a triarylsilyl group including three of the aryl group listed as the examples of the aryl group having 6 to 30 ring carbon atoms. The triarylsilyl group preferably has 18 to 30 carbon atoms.

Herein, an aryl group included in an aralkyl group (occasionally referred to as an arylalkyl group) may be an aromatic hydrocarbon group or a heterocyclic group.

Herein, the aralkyl group having 7 to 30 carbon atoms is preferably an aralkyl group having 6 to 30 ring carbon atoms and is represented by —$Z_3$—$Z_4$. $Z_3$ is exemplified by an alkylene group corresponding to the above alkyl group having 1 to 30 carbon atoms. $Z_4$ is exemplified by the above aryl group having 6 to 30 ring carbon atoms. In the aralkyl group having 7 to 30 carbon atoms, an aryl moiety has 6 to 30 carbon atoms, preferably 6 to 20 carbon atoms, more preferably 6 to 12 carbon atoms and an alkyl moiety has 1 to 30 carbon atoms, preferably 1 to 20 carbon atoms, more preferably 1 to 10 carbon atoms, further preferably 1 to 6 carbon atoms. Examples of the aralkyl group include a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Herein, a substituted phosphoryl group is represented by a formula (P) below.

[Formula 29]

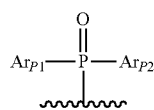

(P)

$Ar_{P1}$ and $Ar_{P2}$ of the formula (P) are each independently a substituent and preferably any group selected from the group consisting of an alkyl group having 1 to 30 carbon atoms and an aryl group having 6 to 30 ring carbon atoms, more preferably any group selected from the group consisting of an alkyl group having 1 to 10 carbon atoms and an aryl group having 6 to 20 ring carbon atoms, further preferably any group selected from the group consisting of an alkyl group having 1 to 6 carbon atoms and an aryl group having 6 to 14 ring carbon atoms.

Herein, the alkoxy group having 1 to 30 carbon atoms is represented by —$OZ_1$. $Z_1$ is exemplified by the above alkyl group having 1 to 30 carbon atoms. Examples of the alkoxy group include a methoxy group, ethoxy group, propoxy group, butoxy group, pentyloxy group and hexyloxy group. The alkoxy group preferably has 1 to 20 carbon atoms.

A halogenated alkoxy group provided by substituting an alkoxy group with a halogen atom is exemplified by one provided by substituting an alkoxy group having 1 to 30 carbon atoms with one or more fluorine atoms.

Herein, an aryl group included in an arylalkoxy group (occasionally referred to as an aryloxy group) may be an aromatic hydrocarbon group or a heterocyclic group.

Herein, the arylalkoxy group having 5 to 30 carbon atoms is represented by —$OZ_2$. $Z_2$ is exemplified by the above aryl group having 6 to 30 ring carbon atoms. The arylalkoxy group preferably has 6 to 20 ring carbon atoms. The arylalkoxy group is exemplified by a phenoxy group.

Herein, a substituted amino group is represented by —$NHR_V$ or —$N(R_V)_2$. Examples of $R_V$ include the above alkyl group having 1 to 30 carbon atoms and the above aryl group having 6 to 30 ring carbon atoms. Examples of the substituted amino group include an alkylamino group and an arylamino group.

Herein, an alkenyl group having 2 to 30 carbon atoms may be linear or branched. Examples of the alkenyl group having 2 to 30 carbon atoms include a vinyl group, propenyl group, butenyl group, oleyl group, eicosapentaenyl group, docosahexaenyl group, styryl group, 2,2-diphenylvinyl group, 1,2,2-triphenylvinyl group, and 2-phenyl-2-propenyl group.

Herein, examples of a cycloalkenyl group having 3 to 30 carbon atoms include a cyclopentadienyl group, cyclopentenyl group, cyclohexenyl group and cyclohexadienyl group.

Herein, an alkynyl group having 2 to 30 carbon atoms may be linear or branched. Examples of the alkynyl group having 2 to 30 carbon atom include ethynyl, propynyl, and 2-phenylethynyl.

Herein, examples of a cycloalkynyl group having 3 to 30 carbon atoms include a cyclopentynyl group and cyclohexynyl group.

Herein, examples of a substituted sulfanyl group include a methyl sulfanyl group, phenyl sulfanyl group, diphenyl sulfanyl group, naphthyl sulfanyl group, and triphenyl sulfanyl group.

Herein, examples of a substituted sulfinyl group include a methyl sulfinyl group, phenyl sulfinyl group, diphenyl sulfinyl group, naphthyl sulfinyl group, and triphenyl sulfinyl group.

Herein, examples of a substituted sulfonyl group include a methyl sulfonyl group, phenyl sulfonyl group, diphenyl sulfonyl group, naphthyl sulfonyl group, and triphenyl sulfonyl group.

Herein, a substituted phosphanyl group is exemplified by a phenyl phosphanyl group.

Herein, examples of a substituted carbonyl group include a methyl carbonyl group, phenyl carbonyl group, diphenyl carbonyl group, naphthyl carbonyl group, and triphenyl carbonyl group.

Herein, an alkoxycarbonyl group having 2 to 30 carbon atoms is represented by —COOY'. Y' is exemplified by the above-described alkyl group.

Herein, a substituted carboxy group is exemplified by a benzoyloxy group.

Herein, an alkylthio group having 1 to 30 carbon atoms and an arylthio group having 6 to 30 ring carbon atoms are represented by —$SR_{V}$. Examples of $R_{V}$ include the above alkyl group having 1 to 30 carbon atoms and the above aryl group having 6 to 30 ring carbon atoms. The alkythio group preferably has 1 to 20 carbon atoms, and the arylthio group has 6 to 20 ring carbon atoms.

Examples of the halogen atom herein include a fluorine atom, chlorine atom, bromine atom and iodine atom, among which a fluorine atom is preferable.

Herein, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a hetero ring including a saturated ring, unsaturated ring, or aromatic ring.

Herein, a hydrogen atom includes isotope having different numbers of neutrons, specifically, protium, deuterium and tritium.

Herein, a substituent when referring to the "substituted or unsubstituted" is at least one group selected from the group consisting of an aryl group having 6 to 30 ring carbon atoms, heteroaryl group having 5 to 30 ring atoms, alkyl group (linear or branched alkyl group) having 1 to 30 carbon atoms, cycloalkyl group having 3 to 30 ring carbon atoms, alkyl halide group having 1 to 30 carbon atoms, alkylsilyl group having 3 to 30 carbon atoms, arylsilyl group having 6 to 30 ring carbon atoms, alkoxy group having 1 to 30 carbon atoms, aryloxy group having 5 to 30 carbon atoms, substituted amino group, alkylthio group having 1 to 30 carbon atoms, arylthio group having 6 to 30 ring carbon atoms, aralkyl group having 5 to 30 carbon atoms, alkenyl group having 2 to 30 carbon atoms, alkynyl group having 2 to 30 carbon atoms, halogen atom, cyano group, hydroxyl group, nitro group, and carboxy group.

Herein, the substituent when referring to the "substituted or unsubstituted" is preferably at least one group selected from the group consisting of an aryl group having 6 to 30 ring carbon atoms, heteroaryl group having 5 to 30 ring atoms, alkyl group (linear or branched alkyl group) having 1 to 30 carbon atoms, cycloalkyl group having 3 to 30 ring carbon atoms, alkyl halide group having 1 to 30 carbon atoms, halogen atom, alkylsilyl group having 3 to 30 carbon atoms, arylsilyl group having 6 to 30 ring carbon atoms, and cyano group, more preferably the specific examples of the substituent that are rendered preferable in the description of each of the substituents.

Herein, the substituent when referring to the "substituted or unsubstituted" may be further substituted by at least one group selected from the group consisting of an aryl group having 6 to 30 ring carbon atoms, heteroaryl group having 5 to 30 ring atoms, alkyl group (linear or branched alkyl group) having 1 to 30 carbon atoms, cycloalkyl group having 3 to 30 ring carbon atoms, alkyl halide group having 1 to 30 carbon atoms, alkylsilyl group having 3 to 30 carbon atoms, arylsilyl group having 6 to 30 ring carbon atoms, alkoxy group having 1 to 30 carbon atoms, aryloxy group having 5 to 30 carbon atoms, substituted amino group, alkylthio group having 1 to 30 carbon atoms, arylthio group having 6 to 30 ring carbon atoms, aralkyl group having 5 to 30 carbon atoms, alkenyl group having 2 to 30 carbon atoms, alkynyl group having 2 to 30 carbon atoms, halogen atom, cyano group, hydroxyl group, nitro group, and carboxy group. In addition, plural ones of these substituents may be mutually bonded to form a ring.

Herein, a substituent further substituting the substituent when referring to the "substituted or unsubstituted" is preferably at least one group selected from the group consisting of an aryl group having 6 to 30 ring carbon atoms, heteroaryl group having 5 to 30 ring atoms, alkyl group (linear or branched alkyl group) having 1 to 30 carbon atoms, halogen atom, and cyano group, more preferably the specific examples of the substituent that are rendered preferable in the description of each of the substituents.

Herein, "unsubstituted" when referring to "substituted or unsubstituted" means that a group is not substituted by the above-described substituents but bonded with a hydrogen atom.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of a substituted ZZ group.

Herein, "XX to YY atoms" in the description of "substituted or unsubstituted ZZ group having XX to YY atoms" represent atoms of an unsubstituted ZZ group and does not include atoms of a substituent(s) of a substituted ZZ group.

The same description as the above applies to "substituted or unsubstituted" in the following compound or a partial structure thereof.

Herein, when substituents are mutually bonded to form a cyclic structure, the cyclic structure is a saturated ring, unsaturated ring, aromatic hydrocarbon ring, or a heterocyclic ring.

Herein, examples of the aryl group and the like for the linking group include a divalent or multivalent group obtained by removing at least one atom from the above-described monovalent groups.

Substrate

The organic EL apparatus 1 may further include a substrate as a support. For instance, glass, quartz, plastics and the like are usable as the substrate. A flexible substrate is also usable. The flexible substrate is a bendable substrate. Examples of the flexible substrate include plastic substrates made of polycarbonate and polyvinyl chloride.

Anode

Metal, alloy, an electrically conductive compound, a mixture thereof and the like which have a large work function (specifically, of 4.0 eV or more) are preferably usable as a material for the anode 2. Specific examples of the material for the anode 2 include indium tin oxide (ITO), indium tin oxide containing silicon or silicon oxide, indium zinc oxide, tungsten oxide, indium oxide containing zinc oxide, and graphene. In addition, the examples of the material for the anode 2 further include gold (Au), platinum (Pt), or nitrides of metal materials (e.g., titanium nitride).

Hole Injecting Layer

A hole injecting layer 3 is a layer containing a highly hole-injectable substance. Examples of the highly hole-injectable substance include molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, aromatic amine compound, and high-molecular weight compound (e.g., oligomer, dendrimer, polymer).

Hole Transporting Layer

A hole transporting layer 4 is a layer containing a highly hole-transportable substance. Examples of the compound usable for the hole transporting layer 4 include an aromatic amine compound, carbazole derivative, and anthracene derivative. A high-molecular weight compound such as poly(N-vinylcarbazole) (abbreviation: PVK) and poly(4-vinyltriphenylamine) (abbreviation: PVTPA) is also usable for the hole transporting layer 4. However, in addition to the above substances, any substance having a hole transporting performance higher than an electron transporting performance may be used for the hole transporting layer 4. A highly hole-transportable substance may be provided in the form of a single layer or a laminated layer of two or more layers of the above substance(s).

Fluorescent Compound

The fluorescent compound contained in the common layer 50, the first emitting layer 15, the second emitting layer 25, and the third emitting layer 35 is a compound capable of emitting light in the singlet state. The kind of the fluorescent compound is not particularly limited to a specific one.

Examples of the blue fluorescent compound include a pyrene derivative, styrylamine derivative, chrysene derivative, fluoranthene derivative, fluorene derivative, diamine derivative, and triarylamine derivative. Specific examples of the blue fluorescent compound include N,N'-bis[4-(9H-carbazole-9-yl)phenyl]-N,N'-diphenylstilbene-4,4'-diamine (abbreviation: YGA2S), 4-(9H-carbazole-9-yl)-4'-(10-phenyl-9-anthryl)triphenylamine (abbreviation: YGAPA), and 4-(10-phenyl-9-anthryl)-4'-(9-phenyl-9H-carbazole-3-yl)triphenylamine (abbreviation: PCBAPA). In addition, the blue fluorescent compound is exemplified by a boron complex compound. Examples of the boron complex compound include bis(azinyl)amine boron complex and pyrromethene boron complex.

The green fluorescent compound is exemplified by an aromatic amine derivative. Specific examples of the green fluorescent compound include N-(9,10-diphenyl-2-anthryl)-N,9-diphenyl-9H-carbazole-3-amine (abbreviation: 2PCAPA), N-[9,10-bis(1,1'-biphenyl-2-yl)-2-anthryl]-N,9-diphenyl-9H-carbazole-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis (1,1'-biphenyl-2-yl)]-N-[4-(9H-carbazole-9-yl)phenyl]-N-phenylanthracene-2-amine (abbreviation: 2YGABPhA), and N,N,9-triphenylanthracene-9-amine (abbreviation: DPhAPhA). In addition, the green fluorescent compound is exemplified by a boron complex compound. Examples of the boron complex compound include bis(azinyl)amine boron complex and pyrromethene boron complex.

The red fluorescent compound is exemplified by a tetracene derivative and diamine derivative. Specific examples of the red fluorescent compound include N,N,N',N'-tetrakis (4-methylphenyl)tetracene-5,11-diamine (abbreviation: p-mPhTD), and 7,14-diphenyl-N,N,N',N'-tetrakis(4-methylphenyl)acenaphtho[1,2-a]fluoranthene-3,10-diamine (abbreviation: p-mPhAFD). In addition, the red fluorescent compound is exemplified by a boron complex compound. Examples of the boron complex compound include bis (azinyl)amine boron complex, and pyrromethene boron complex.

The fluorescent compound is also exemplified by a compound represented by a formula (4) below. The compound represented by the formula (4) is also usable as the blue fluorescent compound.

[Formula 30]

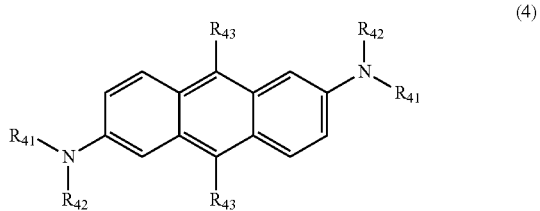

(4)

In the formula (4), $R_{41}$ and $R_{42}$ are each independently a group selected from the group consisting of a substituted or unsubstituted alkyl group having 1 to 30 carbon atoms, a substituted or unsubstituted aryl group having 6 to 30 ring carbon atoms, and a substituted or unsubstituted heteroaryl group having 5 to 30 ring atoms.

$R_{43}$ is each independently a hydrogen atom or a substituent. $R_{43}$ serving as the substituent is a group selected from the group consisting of a substituted or unsubstituted alkyl group having 1 to 30 carbon atoms, a substituted or unsubstituted aryl group having 6 to 30 ring carbon atoms, and a substituted or unsubstituted heteroaryl group having 5 to 30 ring atoms.

When $R_{41}$, $R_{42}$ and $R_{43}$ are the heteroaryl groups, the heteroaryl groups each independently include a nitrogen atom, sulfur atom or oxygen atom.

A plurality of $R_{41}$ are mutually the same or different. A plurality of $R_{42}$ are mutually the same or different. A plurality of $R_{43}$ are mutually the same or different.

The fluorescent compound is also exemplified by a compound represented by a formula (5) below. The compound represented by the formula (5) is also usable as the blue fluorescent compound.

[Formula 31]

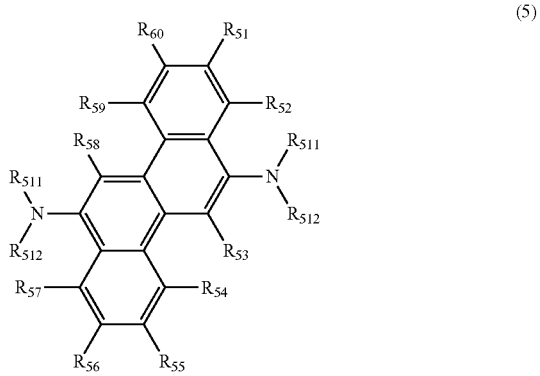

(5)

In the formula (5): $R_{51}$ to $R_{60}$ each independently represent a hydrogen atom or a substituent. $R_{51}$ to $R_{60}$ serving as the substituent are each independently a group selected from the group consisting of the examples of $R_{43}$ serving as the substituent in the formula (4).

$R_{511}$ and $R_{512}$ are groups selected from the group consisting of the examples of $R_{41}$ and $R_{42}$ serving as the substituent in the formula (4). A plurality of $R_{511}$ are mutually the same or different. A plurality of $R_{512}$ are mutually the same or different.

In the formula (5), $R_{51}$ to $R_{60}$ are preferably a hydrogen atom.

In the formula (5), $R_{511}$ and $R_{512}$ are each independently preferably a substituted or unsubstituted aryl group having 6 to 30 ring carbon atoms. A substituent substituting the aryl group having 6 to 30 ring carbon atoms in $R_{511}$ and $R_{512}$ is preferably an alkyl group having 1 to 6 carbon atoms. $R_{511}$ and $R_{512}$ are each independently preferably a substituted or unsubstituted aryl group having 6 to 10 ring carbon atoms, more preferably a substituted or unsubstituted phenyl group.

The fluorescent compound is also exemplified by a compound represented by a formula (6) below. The compound represented by the formula (6) is also usable as the blue fluorescent compound.

[Formula 32]

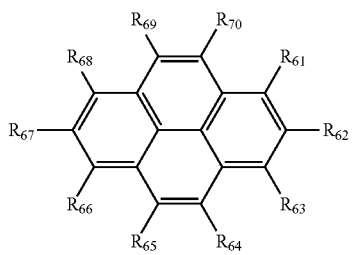

(6)

In the formula (6): $R_{61}$ to $R_{70}$ each independently represent a hydrogen atom or a substituent. $R_{61}$ to $R_{70}$ serving as the substituent are each independently a group selected from the group consisting of the examples of $R_{43}$ serving as the substituent in the formula (4).

$R_{63}$ and $R_{68}$ are $-NR_{611}R_{612}$. Alternatively, $R_{62}$ and $R_{67}$ are $-NR_{611}R_{612}$.

In the formula (6), when $R_{63}$ and $R_{68}$ are $-NR_{611}R_{612}$, $R_{62}$, $R_{64}$, $R_{65}$, $R_{67}$, $R_{69}$, and $R_{70}$ are preferably hydrogen atoms and $R_{61}$ and $R_{66}$ are each preferably a hydrogen atom, alkyl group or cycloalkyl group.

Alternatively, in the formula (6), when $R_{62}$ and $R_{67}$ are $-NR_{611}R_{612}$, $R_{61}$, $R_{63}$, $R_{64}$, $R_{65}$, $R_{66}$, $R_{68}$, $R_{69}$, and $R_{70}$ are preferably hydrogen atoms.

$R_{611}$ and $R_{612}$ in "$-NR_{611}R_{612}$" are each independently a group selected from the group consisting of the examples of $R_{41}$ and $R_{42}$ serving as the substituent in the formula (4). A plurality of $R_{611}$ are mutually the same or different. A plurality of $R_{612}$ are mutually the same or different.

$R_{611}$ and $R_{612}$ are each independently preferably a substituted or unsubstituted aryl group having 6 to 30 ring carbon atoms, more preferably a group selected from the group consisting of a substituted or unsubstituted phenyl group and a substituted or unsubstituted naphthyl group. A substituent substituting the aryl group in $R_{611}$ and $R_{612}$ is exemplified by an alkyl group having 1 to 6 carbon atoms.

The fluorescent compound is also exemplified by a compound represented by a formula (8) below. The compound represented by the formula (8) is also usable as the blue fluorescent compound.

[Formula 33]

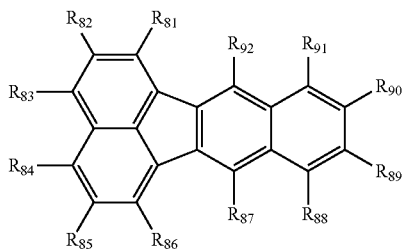

(8)

In the formula (8), $R_{81}$ to $R_{92}$ each independently represent a hydrogen atom or a substituent. $R_{81}$ to $R_{92}$ serving as the substituent are each independently a group selected from the group consisting of the examples of $R_{43}$ serving as the substituent in the formula (4).

The compound represented by the formula (8) is preferably a compound in which $R_{81}$ to $R_{82}$, $R_{84}$ to $R_{86}$ and $R_{88}$ to $R_{91}$ are hydrogen atoms, and $R_{83}$, $R_{87}$ and $R_{92}$ are each a substituted or unsubstituted aryl group having 6 to 30 ring carbon atoms.

The compound represented by the formula (8) is more preferably a compound in which $R_{81}$ to $R_{82}$, $R_{84}$ to $R_{86}$ and $R_{88}$ to $R_{91}$ are hydrogen atoms, $R_{87}$ and $R_{92}$ are each a substituted or unsubstituted aryl group having 6 to 30 ring carbon atoms, and $R_{83}$ is $-Ar_{81}-Ar_{82}$.

$Ar_{81}$ is a substituted or unsubstituted arylene group having 6 to 30 ring carbon atoms.

$Ar_{82}$ is a substituted or unsubstituted aryl group having 6 to 30 ring carbon atoms.

The compound represented by the formula (8) is also preferably a compound in which $R_{81}$ to $R_{82}$, $R_{84}$ to $R_{86}$ and $R_{88}$ to $R_{91}$ are hydrogen atoms, $R_{87}$ and $R_{92}$ are each a substituted or unsubstituted aryl group having 6 to 30 ring carbon atoms, and $R_{83}$ is $-Ar_{81}-Ar_{83}-Ar_{82}$.

$Ar_{81}$ and $Ar_{83}$ are each independently a substituted or unsubstituted arylene group having 6 to 30 ring carbon atoms.

$Ar_{82}$ is a substituted or unsubstituted aryl group having 6 to 30 ring carbon atoms.

The fluorescent compound is also exemplified by a compound represented by a formula (9) below. The compound represented by the formula (9) is also usable as the blue fluorescent compound.

[Formula 34]

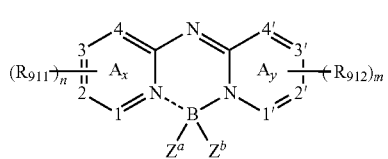

(9)

In the formula (9): a ring $A_x$ and a ring $A_y$ each represent an independent azine ring system corresponding to a six-membered aromatic ring system containing at least one nitrogen atom.

1, 2, 3, and 4 in the ring $A_x$ each independently represent a carbon atom or a nitrogen atom.

1', 2', 3', and 4' in the ring $A_y$ each independently represent a carbon atom or a nitrogen atom.

$R_{911}$ and $R_{912}$ each independently represent a hydrogen atom or a substituent. $R_{911}$ and $R_{912}$ serving as the substituent are each independently a group selected from the group consisting of the examples of $R_{43}$ serving as the substituent in the formula (4).

A plurality of $R_{911}$ are mutually the same or different. A plurality of $R_{912}$ are mutually the same or different.

Two of $R_{911}$ are bonded to each other to form a fused ring including the ring $A_x$, or are not bonded.

Two of $R_{912}$ are bonded to each other to form a fused ring including the ring $A_y$, or are not bonded.

When a fused ring is formed, the fused ring is substituted or unsubstituted. When the fused ring has a substituent, the substituent is a group selected from the group consisting of an aryl group and a heteroaryl group.

m and n each independently represent an integer of 0 to 4.

$Z^a$ and $Z^b$ each independently represent a halogen atom.

The compound represented by the formula (9) is also preferably a compound in which 1, 2, 3, and 4 in the ring $A_x$ are carbon atoms and 1', 2', 3', and 4' in the ring $A_y$ are carbon atoms. The compound in this arrangement is represented by a formula (9-1) below.

[Formula 35]

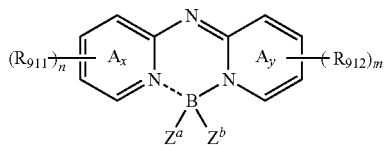

(9-1)

In the formula (9-1): a ring $A_x$ and a ring $A_y$ respectively represent the same as the ring $A_x$ and the ring $A_y$ in the formula (9).

$R_{911}$ and $R_{912}$ respectively represent the same as $R_{911}$ and $R_{912}$ in the formula (9).

m and n each independently represent an integer of 0 to 4.

$Z^a$ and $Z^b$ each independently represent a halogen atom.

In the formula (9-1), it is preferable that m and n are each an integer of 2 to 4, and $R_{911}$ and $R_{912}$ are each a substituent having 2 or more carbon atoms.

When two of $R_{911}$ are bonded to each other to form a fused ring including the ring $A_x$, the fused ring is preferably a quinoline ring or isoquinoline ring.

When two of $R_{912}$ are bonded to each other to form a fused ring including the ring $A_y$, the fused ring is preferably a quinoline ring or isoquinoline ring.

$Z^a$ and $Z^b$ are each preferably a fluorine atom.

Host Material

The first emitting layer 15, the second emitting layer 25 and the third emitting layer 35 may contain the above fluorescent compound dispersed in another substance (host material). Various compounds are usable as a substance for dispersing a highly emittable substance. The host material is preferably a substance having a Lowest Unoccupied Molecular Orbital (LUMO) level higher than that of the highly emittable substance and having a Highest Occupied Molecular Orbital (HOMO) level lower than that of the highly emittable substance. The third compound of the first emitting layer 15, the sixth compound of the second emitting layer 25, and the ninth compound of the third emitting layer 35 may serve as a host material.

Examples of the substance (host material) for dispersing the highly emittable substance include a metal complex, heterocyclic compound, fused aromatic compound, and aromatic amine compound. Examples of the metal complex include an aluminum complex, beryllium complex and zinc complex. Examples of the heterocyclic compound include an oxadiazole derivative, benzimidazole derivative, dibenzofuran derivative, dibenzothiophene derivative, azine derivative, indole derivative, carbazole derivative, and phenanthroline derivative. Examples of the fused aromatic compound include an anthracene derivative, phenanthrene derivative, triphenylene derivative, pyrene derivative, and chrysene derivative. Examples of the aromatic amine compound include triarylamine derivative and fused polycyclic aromatic amine derivative.

The host material is preferably a compound represented by a formula (7) below.

[Formula 36]

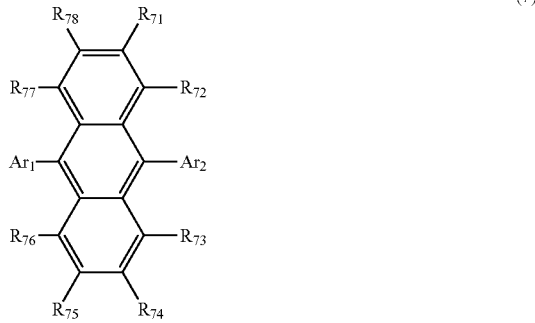

(7)

In the formula (7): $Ar_1$ and $Ar_2$ are each independently a substituted or unsubstituted aryl group having 6 to 30 ring carbon atoms, or a substituted or unsubstituted heteroaryl group having 5 to 30 ring atoms.

$R_{71}$ to $R_{78}$ are each independently a hydrogen atom or a substituent.

$R_{71}$ to $R_{78}$ serving as a substituent are each independently a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkoxycarbonyl group having 2 to 30 carbon atoms, a substituted or unsubstituted silyl group, a carboxyl group, a halogen atom, a cyano group, a nitro group, and a hydroxyl group.

The compound represented by the formula (7) is preferably a compound selected from the group consisting of a compound (7A), a compound (7B), and a compound (7C) below depending on the arrangement and the desired characteristics of an organic EL device to which the compound is applied.

Compound (7A)

The compound (7A) is a compound of the formula (7) in which $Ar_1$ and $Ar_2$ are each independently a substituted or unsubstituted fused aryl group having 10 to 30 ring carbon atoms.

Examples of the compound (7A) include a compound in which $Ar_1$ and $Ar_2$ are the same "substituted or unsubstituted fused aryl group" and a compound in which $Ar_1$ and $Ar_2$ are mutually different "substituted or unsubstituted fused aryl groups".

Specific examples of the compound (7A) include compounds represented by formulae (7-1) to (7-3) below and the compound represented by the formula (7) in which $Ar_1$ and $Ar_2$ are mutually different "substituted or unsubstituted fused aryl groups".

The compound represented by the formula (7-1) is a compound represented by the formula (7) in which $Ar_1$ and $Ar_2$ each are a substituted or unsubstituted 9-phenanthrenyl group.

[Formula 37]

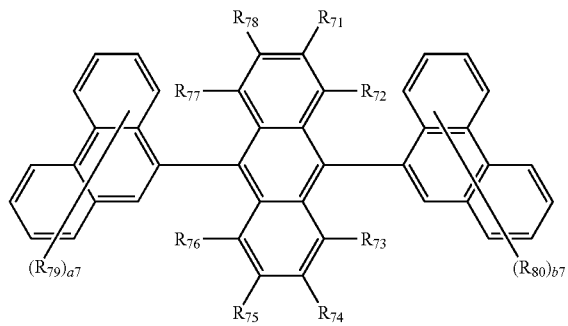

(7-1)

In the formula (7-1), $R_{71}$ to $R_{78}$ each independently represent the same as $R_{71}$ to $R_{78}$ in the formula (7).

$R_{79}$ and $R_{80}$ are each independently a hydrogen atom or a substituent.

$R_{79}$ and $R_{80}$ serving as a substituent are each independently a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkoxycarbonyl group having 2 to 30 carbon atoms, a substituted or unsubstituted silyl group, a carboxyl group, a halogen atom, a cyano group, a nitro group, and a hydroxyl group.

a7 is 9 and a plurality of $R_{79}$ are bonded to a 9-phenanthrenyl group corresponding to $Ar_1$.

b7 is 9 and a plurality of $R_{80}$ are bonded to a 9-phenanthrenyl group corresponding to $Ar_2$.

Provided that the two substituted or unsubstituted 9-phenanthrenyl groups are the same, the plurality of $R_{79}$ are the same or different and and the plurality of $R_{80}$ are the same or different.

The compound represented by the formula (7-2) is a compound represented by the formula (7) in which $Ar_1$ and $Ar_2$ each are a substituted or unsubstituted 2-naphthyl group.

[Formula 38]

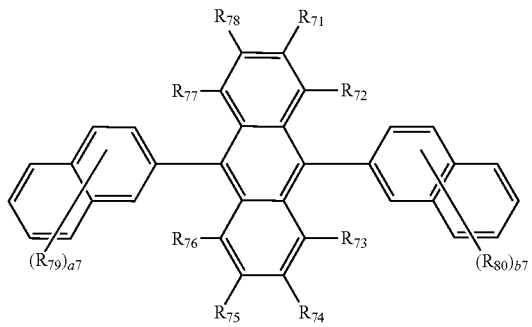

(7-2)

In the formula (7-2), $R_{71}$ to $R_{78}$ each independently represent the same as $R_{71}$ to $R_{78}$ in the formula (7).

$R_{79}$ and $R_{80}$ each independently represent the same as $R_{79}$ and $R_{80}$ in the formula (7-1).

a7 is 7 and a plurality of $R_{79}$ are bonded to a 2-naphthyl group corresponding to $Ar_1$.

b7 is 7 and a plurality of $R_{80}$ are bonded to a 2-naphthyl group corresponding to $Ar_2$.

Provided that the two substituted or unsubstituted 2-naphthyl groups are the same, the plurality of $R_{79}$ are the same or different and and the plurality of $R_{80}$ are the same or different.

The compound represented by the formula (7-3) is a compound represented by the formula (7) in which $Ar_1$ and $Ar_2$ each are a substituted or unsubstituted 1-naphthyl group.

[Formula 39]

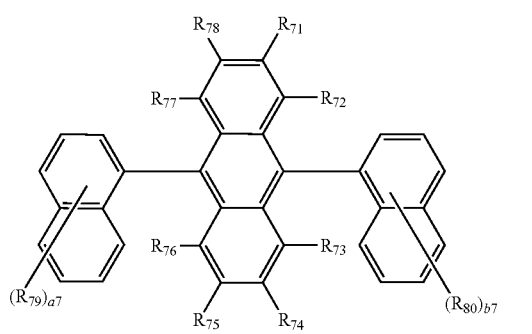

(7-3)

In the formula (7-3), $R_{71}$ to $R_{78}$ each independently represent the same as $R_{71}$ to $R_{78}$ in the formula (7).

$R_{79}$ and $R_{80}$ each independently represent the same as $R_{79}$ and $R_{80}$ in the formula (7-1).

a7 is 7 and a plurality of $R_{79}$ are bonded to a 1-naphthyl group corresponding to $Ar_1$.

b7 is 7 and a plurality of $R_{80}$ are bonded to a 1-naphthyl group corresponding to $Ar_2$.

Provided that the two substituted or unsubstituted 1-naphthyl groups are the same, the plurality of $R_{79}$ are the same or different and and the plurality of $R_{80}$ are the same or different.

In the compound of the formula (7) in which $Ar_1$ and $Ar_2$ are mutually different "substituted or unsubstituted fused aryl groups," $Ar_1$ and $Ar_2$ are each independently preferably a group selected from the group consisting of a substituted or unsubstituted 9-phenanthrenyl group, a substituted or unsubstituted 1-naphthyl group, and a substituted or unsubstituted 2-naphthyl group.

Specifically, a more preferable compound is selected from a compound of the formula (7) in which $Ar_1$ is a substituted or unsubstituted 1-naphthyl group and $Ar_2$ is a substituted or unsubstituted 2-naphthyl group, a compound of the formula (7) in which $Ar_1$ is a substituted or unsubstituted 1-naphthyl group and $Ar_2$ is a substituted or unsubstituted 9-phenanthrenyl group, and a compound of the formula (7) in which $Ar_1$ is a substituted or unsubstituted 2-naphthyl group and $Ar_2$ is a substituted or unsubstituted 9-phenanthrenyl group.

Compound (7B)

The compound (7B) is a compound of the formula (7) in which one of $Ar_1$ and $Ar_2$ is a substituted or unsubstituted phenyl group and the other of of $Ar_1$ and $Ar_2$ is a substituted or unsubstituted fused aryl group having 10 to 30 ring carbon atoms. The compound (7B) is specifically exemplified by a compound represented by a formula (7-4) below and a compound represented by a formula (7-5) below.

The compound represented by the formula (7-4) is a compound of the formula (7) in which $Ar_1$ is a substituted or unsubstituted phenyl group and $Ar_2$ is a substituted or unsubstituted 1-naphthyl group.

[Formula 40]

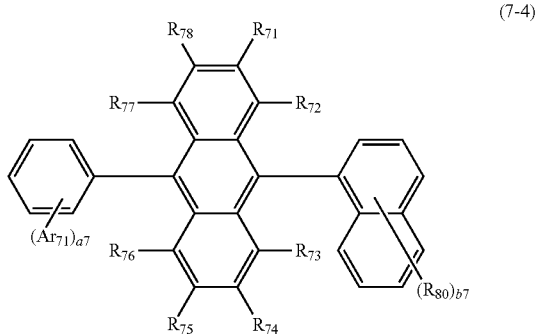

(7-4)

In the formula (7-4), $R_{71}$ to $R_{78}$ each independently represent the same as $R_{71}$ to $R_{78}$ in the formula (7).

$R_{80}$ each independently represent the same as $R_{80}$ in the formula (7-1).

$Ar_{71}$ is each independently a hydrogen atom or a substituent.

$Ar_{71}$ serving as a substituent is each independently a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted cycloalkyl group having 3 to 30 ring carbon atoms, a substituted or unsubstituted aralkyl group having 7 to 30 carbon atoms, a 9,9-dimethylfluorene-1-yl group, a 9,9-dimethylfluorene-2-yl group, a 9,9-dimethylfluorene-3-yl group, a 9,9-dimethylfluorene-4-yl group, a dibenzofuran-1-yl group, a dibenzofuran-2-yl group, a dibenzofuran-3-yl group, and a dibenzofuran-4-yl group.

a7 is 5 and a plurality of $Ar_{71}$ are bonded to a phenyl group corresponding to $Ar_1$.

b7 is 7 and a plurality of $R_{80}$ are bonded to a 1-naphthyl group corresponding to $Ar_2$.

A plurality of $Ar_{71}$ are mutually the same or different. A plurality of $R_{80}$ are mutually the same or different.

The plurality of $Ar_{71}$ form a fused ring group together with a benzene ring to which the plurality of $Ar_{71}$ are bonded, or do not form a ring. The fused ring group in this arrangement is exemplified by a substituted or unsubstituted fluorenyl group and a substituted or unsubstituted dibenzofuranyl group.

The compound represented by the formula (7-5) is a compound represented by the formula (7) in which $Ar_1$ is a substituted or unsubstituted phenyl group and $Ar_2$ is a substituted or unsubstituted 2-naphthyl group.

[Formula 41]

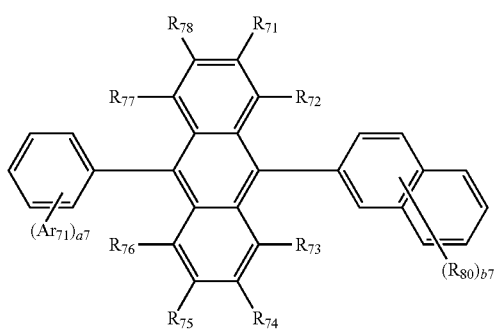

(7-5)

In the formula (7-5), $R_{71}$ to $R_{78}$ each independently represent the same as $R_{71}$ to $R_{78}$ in the formula (7).

$R_{80}$ each independently represent the same as $R_{80}$ in the formula (7-1).

$Ar_{71}$ is each independently a hydrogen atom or a substituent.

$Ar_{71}$ serving as a substituent is each independently a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted cycloalkyl group having 3 to 30 ring carbon atoms, a substituted or unsubstituted aralkyl group having 7 to 30 carbon atoms, a dibenzofuran-1-yl group, a dibenzofuran-2-yl group, a dibenzofuran-3-yl group, and a dibenzofuran-4-yl group.

a7 is 5 and a plurality of $Ar_{71}$ are bonded to a phenyl group corresponding to $Ar_1$.

b7 is 7 and a plurality of $R_{80}$ are bonded to a 2-naphthyl group corresponding to $Ar_2$.

A plurality of $Ar_{71}$ are mutually the same or different. A plurality of $R_{80}$ are mutually the same or different.

The plurality of $Ar_{71}$ form a fused ring group together with a benzene ring to which the plurality of $Ar_{71}$ are bonded, or do not form a fused ring group. The fused ring group in this arrangement is exemplified by a substituted or unsubstituted fluorenyl group and a substituted or unsubstituted dibenzofuranyl group.

Compound (7C)

The compound (7C) is represented by a formula (7-6) below. Specifically, the compound (7C) is preferably a compound represented by any one of formulae (7-6-1), (7-6-2) and (7-6-3).

[Formula 42]

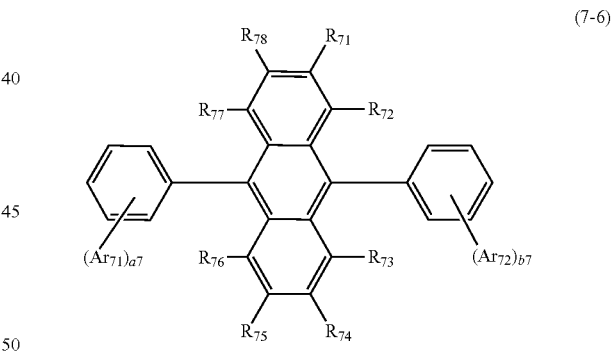

(7-6)

In the formula (7-6), $R_{71}$ to $R_{78}$ each independently represent the same as $R_{71}$ to $R_{78}$ in the formula (7).

$Ar_{71}$ represent the same as $Ar_{71}$ in the formula (7-4).

$Ar_{72}$ is a hydrogen atom or a substituent.

$Ar_{72}$ serving as a substituent is each independently a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted cycloalkyl group having 3 to 30 ring carbon atoms, and a substituted or unsubstituted aralkyl group having 7 to 30 carbon atoms.

a7 is 5 and a plurality of $Ar_{71}$ are bonded to a phenyl group corresponding to $Ar_1$.

b7 is 5 and a plurality of $Ar_{72}$ are bonded to a phenyl group corresponding to $Ar_2$.

A plurality of $Ar_{71}$ are mutually the same or different. A plurality of $Ar_{72}$ are mutually the same or different.

$Ar_{71}$ and $Ar_{72}$ are each independently selected.

[Formula 43]

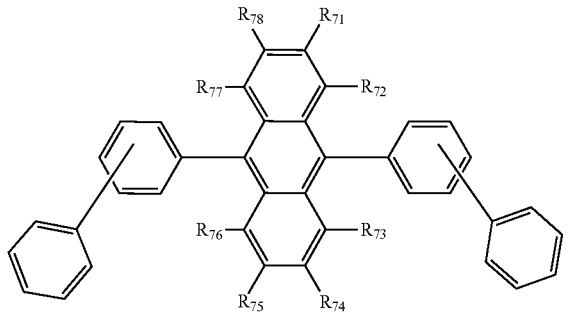

(7-6-1)

In the formula (7-6-1), $R_{71}$ to $R_{78}$ each independently represent the same as $R_{71}$ to $R_{78}$ in the formula (7).

[Formula 44]

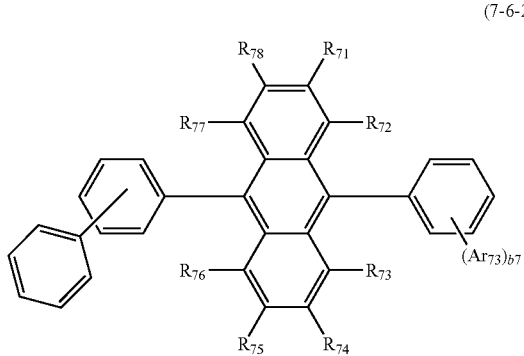

(7-6-2)

In the formula (7-6-2), $R_{71}$ to $R_{78}$ each independently represent the same as $R_{71}$ to $R_{78}$ in the formula (7).

$Ar_{73}$ is a substituted or unsubstituted fused aryl group having 10 to 20 ring carbon atoms.

b7 is 5 and a plurality of $Ar_{73}$ are bonded to a phenyl group corresponding to $Ar_2$.

A plurality of $Ar_{73}$ are mutually the same or different.

[Formula 45]

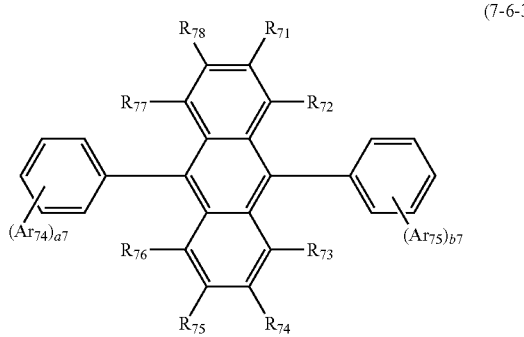

(7-6-3)

In the formula (7-6-3), $R_{71}$ to $R_{78}$ represent the same as $R_{71}$ to $R_{78}$ in the formula (7).

$Ar_{74}$ and $Ar_{75}$ are each independently a substituted or unsubstituted fused aryl group having 10 to 20 ring carbon atoms.

a7 is 5 and a plurality of $Ar_{74}$ are bonded to a phenyl group corresponding to $Ar_1$.

b7 is 5 and a plurality of $Ar_{75}$ are bonded to a phenyl group corresponding to $Ar_2$.

A plurality of $Ar_{74}$ are mutually the same or different. A plurality of $Ar_{75}$ are mutually the same or different.

The compound represented by the formula (7) is also preferably a compound represented by a formula (70) below depending on the arrangement and the desired characteristics of an organic EL device to which the compound is applied.

[Formula 46]

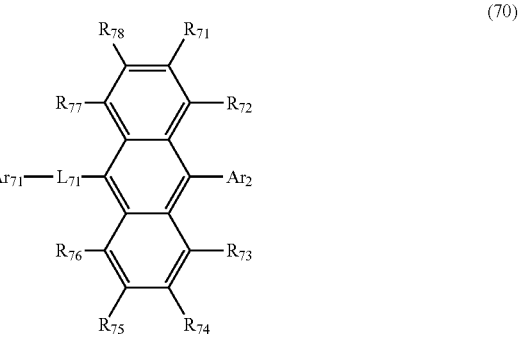

(70)

In the formula (70), $Ar_2$ is a substituted or unsubstituted aryl group having 6 to 30 ring carbon atoms, or a substituted or unsubstituted heteroaryl group having 5 to 30 ring atoms.

$R_{71}$ to $R_{78}$ are each independently a hydrogen atom or a substituent.

$R_{71}$ to $R_{78}$ serving as a substituent are each independently a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkoxycarbonyl group having 2 to 30 carbon atoms, a substituted or unsubstituted silyl group, a substituted or unsubstituted amino group, a carboxyl group, a halogen atom, a cyano group, a nitro group, and a hydroxyl group.

$L_{71}$ is a single bond or a linking group.

$L_{71}$ as a substituent is a substituted or unsubstituted divalent arylene group, a substituted or unsubstituted divalent heterocyclic group, or a group formed by linking two to four linking groups selected from the group consisting of a substituted or unsubstituted divalent arylene group and a substituted or unsubstituted divalent heterocyclic group.

Ar$_{71}$ is a group represented by a formula (71), (72) or (73).

[Formula 47]

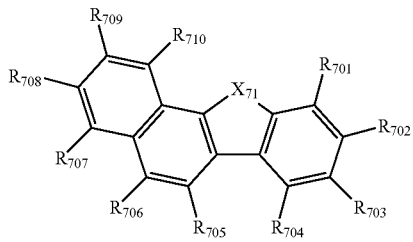

(71)

[Formula 48]

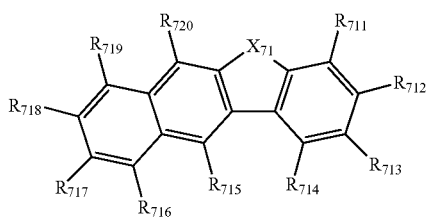

(72)

[Formula 49]

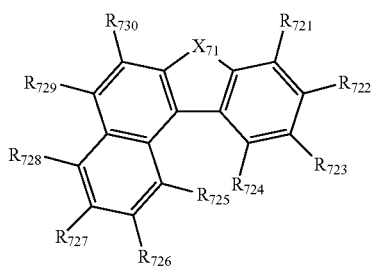

(73)

In the formulae (71), (72) and (73), X$_{71}$ is an oxygen atom or a sulfur atom.

R$_{701}$ to R$_{710}$, R$_{711}$ to R$_{720}$, and R$_{721}$ to R$_{730}$ each independently represent a hydrogen atom, a substituent, or a single bond to be bonded to L$_{71}$.

Any one of R$_{701}$ to R$_{710}$ is a single bond to be bonded to L$_{71}$.

Any one of R$_{711}$ to R$_{720}$ is a single bond to be bonded to L$_7$.

Any one of R$_{721}$ to R$_{730}$ is a single bond to be bonded to L$_{71}$.

R$_{701}$ to R$_{710}$, R$_{711}$ to R$_{720}$, and R$_{721}$ to R$_{730}$ serving as a substituent are each independently a group selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted cycloalkyl group having 3 to 30 ring carbon atoms, a substituted or unsubstituted alkoxy group having 1 to 30 carbon atoms, a substituted or unsubstituted aralkyl group having 7 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkoxycarbonyl group having 2 to 30 carbon atoms, a substituted or unsubstituted silyl group, a substituted or unsubstituted amino group, a carboxyl group, a halogen atom, a cyano group, a nitro group, and a hydroxyl group.

In the exemplary embodiment, the substituent in the above formulae regarding the host material may be selected from the specific examples of the substituents described above, or may be a substituent described below.

The substituted or unsubstituted aryl group having 6 to 30 ring carbon atoms as the substituent in the formulae regarding the host material is a group selected from the group consisting of a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 6-chrysenyl group, 1-benzo[c]phenanthryl group, 2-benzo[c]phenanthryl group, 3-benzo[c]phenanthryl group, 4-benzo[c]phenanthryl group, 5-benzo[c]phenanthryl group, 6-benzo[c]phenanthryl group, 1-benzo[g]chrysenyl group, 2-benzo[g]chrysenyl group, 3-benzo[g]chrysenyl group, 4-benzo[g]chrysenyl group, 5-benzo[g]chrysenyl group, 6-benzo[g]chrysenyl group, 7-benzo[g]chrysenyl group, 8-benzo[g]chrysenyl group, 9-benzo[g]chrysenyl group, 10-benzo[g]chrysenyl group, 11-benzo[g]chrysenyl group, 12-benzo[g]chrysenyl group, 13-benzo[g]chrysenyl group, 14-benzo[g]chrysenyl group, 1-triphenyl group, 2-triphenyl group, 2-fluorenyl group, 9,9-dimethylfluorene-2-yl group, benzofluorenyl group, dibenzofluorenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butyl groupphenyl group, p-(2-phenylpropyl)phenyl group, 3-methyl-2-naphthyl group, 4-methyl-1-naphthyl group, 4-methyl-1-anthryl group, 4'-methyl biphenylyl group, and 4"-t-butyl-p-terphenyl-4-yl group, preferably a group selected from the group consisting of an unsubstituted phenyl group, substituted phenyl group, and a substituted or unsubstituted aryl group having 10 to 14 ring carbon atoms (e.g., 1-naphthyl group, 2-naphthyl group, 9-phenanthryl group), a substituted or unsubstituted fluorenyl group (2-fluorenyl group), and a substituted or unsubstituted pyrenyl group (1-pyrenyl group, 2-pyrenyl group, 4-pyrenyl group).

Moreover, examples of a substituted or unsubstituted fused aryl group having 10 to 30 ring carbon atoms as the substituent in the formulae regarding the host material include a 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, and 2-fluorenyl group, among which the substituted or unsubstituted fused aryl group is preferably selected from the group consisting of a 1-naphthyl group, 2-naphthyl group, 9-phenanthryl group, and fluorenyl group (2-fluorenyl group).

The substituted or unsubstituted heteroaryl group having 5 to 30 ring atoms as the substituent in the formulae regarding the host material is a group selected from the group consisting of a 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 1-dibenzofuranyl group, 2-dibenzofuranyl group, 3-dibenzofuranyl group, 4-dibenzofuranyl group, 1-dibenzothienyl group, 2-dibenzothienyl group, 3-dibenzothienyl group, 4-dibenzothienyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl, 5-oxadiazolyl, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butyl group pyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group. The substituted or unsubstituted heteroaryl group having 5 to 30 ring atoms is preferably selected from the group consisting of a 1-dibenzofuranyl group, 2-dibenzofuranyl group, 3-dibenzofuranyl group, 4-dibenzofuranyl group, 1-dibenzothienyl group, 2-dibenzothienyl group, 3-dibenzothienyl group, 4-dibenzothienyl group, 1-carbazolyl group, 2-carbazolyl group, 3-carbazolyl group, 4-carbazolyl group, and 9-carbazolyl group.

The substituted or unsubstituted alkyl group having 1 to 30 carbon atoms as the substituent in the formulae regarding the host material is a group selected from the group consisting of a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group. The substituted or unsubstituted alkyl group having 1 to 30 carbon atoms is preferably selected from the group consisting of a methyl group, ethyl group, propyl group, isopropyl group, n-butyl group, s-butyl group, isobutyl group, and t-butyl group.

Examples of a substituted or unsubstituted cycloalkyl group having 3 to 30 ring carbon atoms as the substituent in the formulae regarding the host material include a cyclopropyl group, cyclobutyl group, cyclopentyl group, cyclohexyl group, 4-methylcyclohexyl group, 1-adamantyl group, 2-adamantyl group, 1-norbornyl group, and 2-norbornyl group, among which a cyclopentyl group or a cyclohexyl group is preferable.

The substituted or unsubstituted alkoxy group having 1 to 30 carbon atoms as the substituent in the formulae regarding the host material is a group represented by —OZ, in which Z is selected from a substituted or unsubstituted alkyl group having 1 to 30 carbon atoms.

Examples of a substituted or unsubstituted aralkyl group having 7 to 30 carbon atoms (in which an aryl moiety has 6 to 29 carbon atoms and an alkyl moiety has 1 to 30 carbon atoms) as the substituent in the formulae regarding the host material include a benzyl group, 1-phenylethyl group, 2-phenylethyl group, 1-phenyl isopropyl group, 2-phenyl isopropyl group, phenyl-t-butyl group, α-naphthylmethyl group, 1-α-naphthylethyl group, 2-α-naphthylethyl group, 1-α-naphthyl isopropyl group, 2-α-naphthyl isopropyl group, β-naphthylmethyl group, 1-β-naphthylethyl group, 2-β-naphthylethyl group, 1-β-naphthyl isopropyl group, 2-β-naphthyl isopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenyl isopropyl group, and 1-chloro-2-phenyl isopropyl group.

A substituted or unsubstituted aryloxy group having 6 to 30 ring carbon atoms as the substituent in the formulae regarding the host material is represented by —OY.

A substituted or unsubstituted arylthio group having 6 to 30 ring carbon atoms as the substituent in the formulae regarding the host material is represented by —SY. Y in —OY and —SY is selected from a substituted or unsubstituted aryl group having 6 to 30 ring carbon atoms as the substituent in the formulae regarding the host material.

A substituted or unsubstituted alkoxycarbonyl group having 2 to 30 carbon atoms (an alkyl moiety has 1 to 29 carbon atoms) as the substituent in the formulae regarding the host material is a group represented by —COOZ, in which Z is selected from a substituted or unsubstituted alkyl group having 1 to 30 carbon atoms as the substituent in the formulae regarding the host material.

Examples of the substituted silyl group as the substituent in the formulae regarding the host material include a trimethylsilyl group, triethylsilyl group, t-butyldimethylsilyl group, vinyldimethylsilyl group, propyldimethylsilyl group, and triphenylsilyl group.

Examples of the halogen atom as the substituent in the formulae regarding the host material include fluorine, chlorine, bromine, and iodine.

Electron Transporting Layer

The electron transporting layer 6 is a layer containing a highly electron-transportable substance. Examples of the compound usable for the electron transporting layer 6 include a metal complex, heterocyclic aromatic compound and high-molecular weight compound. Examples of the metal complex include an aluminum complex, beryllium complex and zinc complex. Examples of the heterocyclic aromatic compound include an imidazole derivative, benzimidazole derivative, azine derivative, carbazole derivative, and phenanthroline derivative.

Electron Injecting Layer

The electron injecting layer 7 is a layer containing a highly electron-injectable substance. Examples of the compound usable for the electron injecting layer 7 include an alkali metal, alkaline earth metal, alkali metal compound and alkaline earth metal compound. Examples of the compound usable for the electron injecting layer 7 include lithium (Li), lithium fluoride (LiF), cesium fluoride (CsF), calcium fluoride ($CaF_2$), and lithium oxide (LiOx). Examples of the metal complex include a lithium quinolinolate (LiQ) complex.

Cathode

Metal, alloy, an electrically conductive compound, a mixture thereof and the like, which have a small work function, specifically, of 3.8 eV or less, is preferably usable as a material for the cathode 8. Specific examples of the compound usable for the cathode 8 include: the elements belonging to Groups 1 and 2 of the periodic table of the elements, namely, an alkali metal such as lithium (Li) and cesium (Cs) and an alkaline earth metal such as magnesium (Mg); alloy thereof (e.g., MgAg, AlLi); a rare earth metal such as europium (Eu) and ytterbium (Yb); and alloy thereof.

Film Thickness

A film thickness of each of the layers of the organic EL apparatus 1 is not limited to a specific value. Typically, an excessively-thinned film is likely to cause defects such as a pin hole, whereas an excessively-thickened film needs to be applied with a high voltage, resulting in a poor efficiency. Accordingly, the film thickness is typically preferably in a range of several nanometers to 1 μm.

Layer Formation Method(s)

A method for forming each of the layers of the organic EL apparatus 1 is not limited to a specific method. Known methods such as dry film-forming and wet film-forming are applicable. Examples of the dry film-forming include vacuum deposition, sputtering, plasma and ion plating. Examples of the wet film-forming include spin coating, dipping, flow coating and ink-jet printing.

Electronic Device

The organic EL apparatus 1 is usable for an electronic device such as a display unit and a light-emitting unit. Examples of the display unit include display components such as an organic EL panel module, TV, mobile phone, tablet, and personal computer. Examples of the light-emitting unit include an illuminator and a vehicle light.

Second Exemplary Embodiment

Arrangement(s) of an organic EL apparatus according to a second exemplary embodiment will be described below. In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable for a material and a compound which are not particularly described.

Figure 4:
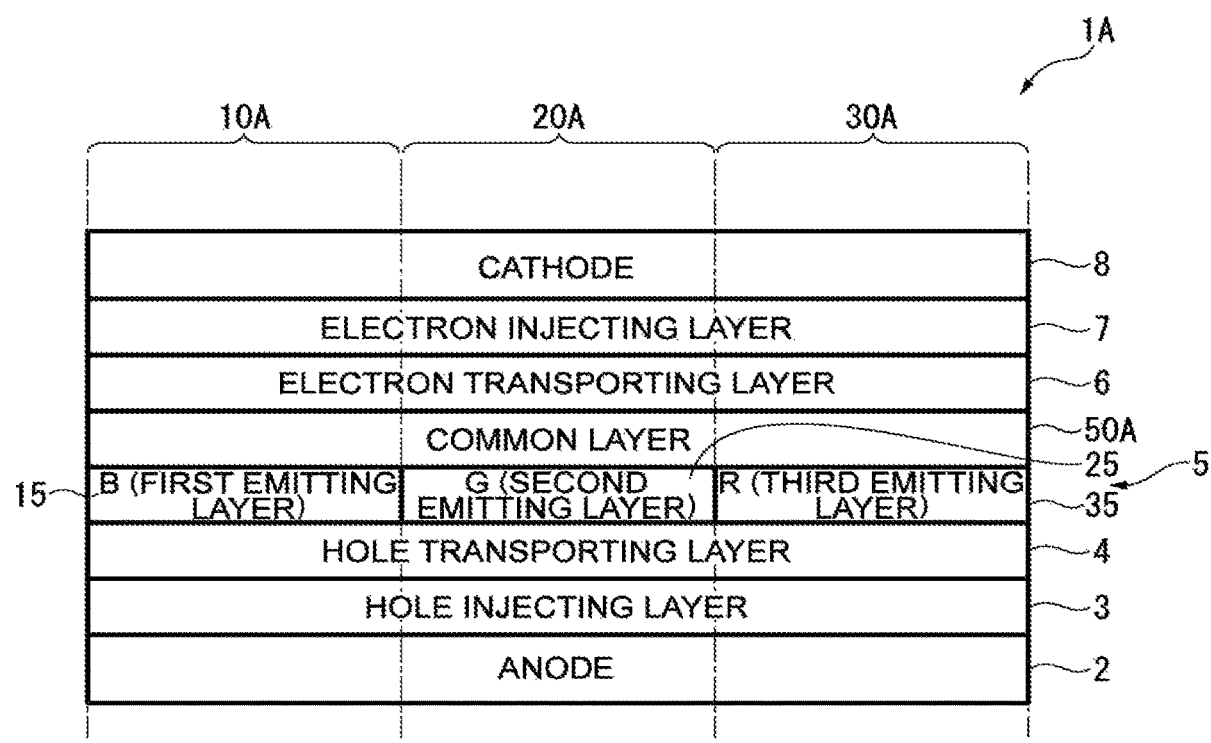
FIG. 4 schematically shows an organic EL apparatus according to a second exemplary embodiment.

FIG. 4 schematically shows an organic EL apparatus 1A according to the second exemplary embodiment.

The organic EL apparatus 1A according to the second exemplary embodiment is different in the arrangement of the common layer from the organic EL apparatus 1 according to the first exemplary embodiment. Other components are the same as those in the first exemplary embodiment.

The organic EL apparatus 1A includes a first pixel 10A, a second pixel 20A and a third pixel 30A. In the organic EL apparatus 1A of the exemplary embodiment, the first pixel 10A, the second pixel 20A, and third pixel 30A are provided in parallel to each other. In the exemplary embodiment, the organic EL apparatus 1A in which the first pixel 10A emits blue light, the second pixel 20A emits green light, and the third pixel 30A emits red light is exemplarily described.

The organic EL apparatus 1A includes the anode 2, the hole injecting layer 3, the hole transporting layer 4, the emitting zone 5, a common layer 50A, the electron transporting layer 6, the electron injecting layer 7, and the cathode 8. The anode 2, hole injecting layer 3, hole transporting layer 4, emitting zone 5, common layer 50A, electron transporting layer 6, electron injecting layer 7, and cathode 8 are laminated in this order. The structure of the emitting zone 5 is the same as that in the first exemplary embodiment.

Common Layer

The common layer 50A is provided between the anode 2 and the cathode 8 and extends across the first pixel 10A, the second pixel 20A and the third pixel 30A to be shared by the first pixel 10A, the second pixel 20A and the third pixel 30A. The common layer 50A is provided between the emitting zone 5 and the electron transporting layer 6. The common layer 50A of the exemplary embodiment is in contact with a side of the emitting zone 5 close to the cathode.

A compound composition of the common layer 50A is different from a compound composition of the first emitting layer 15, a compound composition of the second emitting layer 25, and a compound composition of the third emitting layer 35. The common layer 50 and the first emitting layer 15 are formed of the same compound in the first exemplary embodiment, whereas the common layer 50A is formed differently from the first emitting layer 15 in the second exemplary embodiment. The common layer 50A is also formed differently from the second emitting layer 25 and the third emitting layer 35.

Herein, that a compound composition of a layer is different from a compound composition of another layer means that the compound compositions of the respective layers are not identical. For instance, the first emitting layer 15 contains an X compound and a Y compound and the second emitting layer 25 contains a Z compound and a W compound, while the common layer 50 contains an A compound or contains the X compound, the Y compound and the A compound. Moreover, for instance, when the first emitting layer 15 contains the X compound and the Y compound, the second emitting layer 25 contains the Z compound and the W compound, and the common layer 50 contains the X compound and no Y compound, the compound compositions of the respective layers are not identical. Accordingly, such a case corresponds to the case having a different compound composition. The same interpretation also applies to the second exemplary embodiment including the third emitting layer 35.

For instance, after forming the first emitting layer 15, the second emitting layer 25 and the third emitting layer 35, using a compound different from the compounds used for forming the first emitting layer 15, the second emitting layer 25 and the third emitting layer 35, the common layer 50A can be formed on the first emitting layer 15, the second emitting layer 25 and the third emitting layer 35 in a manner to extend across the first pixel 10A, the second pixel 20A and the third pixel 30A to be shared by the first pixel 10A, the second pixel 20A and the third pixel 30A.

In the organic EL apparatus 1A of the second exemplary embodiment, the common layer 50A contains a fourth compound. The common layer 50A does not contain a delayed fluorescent compound. The common layer 50A preferably does not contain a phosphorescent metal complex.

First Pixel, Second Pixel and Third Pixel

The first pixel 10A includes the anode 2, hole injecting layer 3, hole transporting layer 4, first emitting layer 15, common layer 50A, electron transporting layer 6, electron injecting layer 7 and cathode 8. The first emitting layer 15 is in contact with the common layer 50.

The second pixel 20A includes the anode 2, hole injecting layer 3, hole transporting layer 4, second emitting layer 25, common layer 50A, electron transporting layer 6, electron injecting layer 7 and cathode 8. The second emitting layer 25 is in contact with the common layer 50.

The third pixel 30A includes the anode 2, hole injecting layer 3, hole transporting layer 4, third emitting layer 35, common layer 50, electron transporting layer 6, electron injecting layer 7 and cathode 8. The third emitting layer 35 is in contact with the common layer 50.

The first emitting layer 15, second emitting layer 25 and third emitting layer 35 are the same as those in the first exemplary embodiment.

The peak wavelength of the emission from the first emitting layer 15 is preferably smaller than the peak wavelength of the emission from the second emitting layer 25, and further the peak wavelength of the emission from the second emitting layer 25 is preferably smaller than the peak wavelength of the emission from the third emitting layer 35.

In addition, the relationship between the compounds in the emitting layers in the first exemplary embodiment is suitably applicable to the second exemplary embodiment.

Relationship Between Each Emitting Layer and Common Layer

The first compound and the third compound of the first emitting layer 15 preferably satisfy the following relationship with the fourth compound of the common layer 50A in order to efficiently cause a phenomenon that two triplet excitons collide with each other to generate a singlet exciton in the first emitting layer 15 (hereinafter, referred to as a Triplet-Triplet Fusion=TTF phenomenon) and improve a luminous efficiency.

A singlet energy $S1(B_D)$ of the first compound and a singlet energy $S1(B_H)$ of the third compound preferably satisfy a relationship of $S1(B_H) > S1(B_D)$ and an energy gap $T_{77K}(B_H)$ at 77K of the third compound and an energy gap $T_{77K}(C)$ at 77K of the fourth compound preferably satisfy a relationship of $T_{77K}(C) \geq T_{77K}(B_H)$, more preferably a relationship of $T_{77K}(C) > T_{77K}(B_H)$.

The singlet energy $S1(B_H)$ of the third compound and a singlet energy $S1(C)$ of the fourth compound preferably satisfy a relationship of $S1(C) \geq S1(B_H)$, more preferably a relationship of $S1(C) > S1(B_H)$.

An energy gap $T_{77K}(B_D)$ at 77K of the first compound and the energy gap $T_{77K}(B_H)$ at 77K of the third compound preferably satisfy a relationship of $T_{77K}(B_D) > T_{77K}(B_H)$.

The first compound, third compound and fourth compound more preferably satisfy a relationship of $T_{77K}(B_D) > T_{77K}(B_H)$ and $T_{77K}(C) > T_{77K}(B_H)$.

It is also preferable that the first compound, third compound and fourth compound satisfy the relationship of $T_{77K}(B_D) > T_{77K}(B_H)$ and $T_{77K}(C) > T_{77K}(B_H)$ and further satisfy a relationship of $T_{77K}(C) > T_{77K}(B_D)$ (i.e., to satisfy a relationship of $T_{77K}(C) > T_{77K}(B_D) > T_{77K}(B_H)$). On the other hand, it is also preferable that the first compound, third compound and fourth compound satisfy the relationship of $T_{77K}(B_D) > T_{77K}(B_H)$ and $T_{77K}(C) > T_{77K}(B_H)$ and further satisfy a relationship of $T_{77K}(B_D) > T_{77K}(C)$ (i.e., to satisfy a relationship of $T_{77K}(B_D) > T_{77K}(C) > T_{77K}(B_H)$).

The delayed fluorescent second compound of the second emitting layer 25 and the fourth compound of the common layer 50A preferably satisfy the following relationship in order to block hole transfer from the second emitting layer 25 to the common layer 50A.

An ionization potential $Ip(G_{DF})$ of the second compound and an ionization potential $Ip(C)$ of the fourth compound preferably satisfy a relationship of $Ip(C) \geq Ip(G_{DF})$, more preferably a relationship of $Ip(C) > Ip(G_{DF})$.

The delayed fluorescent seventh compound of the third emitting layer 35 and the fourth compound of the common layer 50A preferably satisfy the following relationship in order to block hole transfer from the third emitting layer 35 to the common layer 50A.

An ionization potential Ip($R_{DF}$) of the seventh compound and the ionization potential Ip(C) of the fourth compound preferably satisfy a relationship of Ip(C)≥Ip($R_{DF}$), more preferably a relationship of Ip(C)>Ip($R_{DF}$).

Also in the exemplary embodiment, since the emitting layer of each pixel of the organic EL apparatus 1A is not a phosphorescent layer but the fluorescent layer (i.e., the first emitting layer 15) or the emitting layer containing the delayed fluorescent compound (i.e., the second emitting layer 25 and the third emitting layer 35), a variety of choice of compounds usable for the common layer 50A extending across a plurality of pixels to be shared by the pixels can be given and a lifetime of the organic EL apparatus 1A can be prolonged.

Moreover, a drive voltage of the organic EL apparatus 1A can be reduced as compared with an organic EL apparatus including the phosphorescent layer.

Third Exemplary Embodiment

Arrangement(s) of an organic EL apparatus according to a third exemplary embodiment will be described below. In the description of the third exemplary embodiment, the same components as those in the first and second exemplary embodiments are denoted by the same reference signs and names to simplify or omit the explanation of the components. In the third exemplary embodiment, the same materials and compounds as described in the first and second exemplary embodiments are usable for a material and a compound which are not particularly described.

Figure 5:
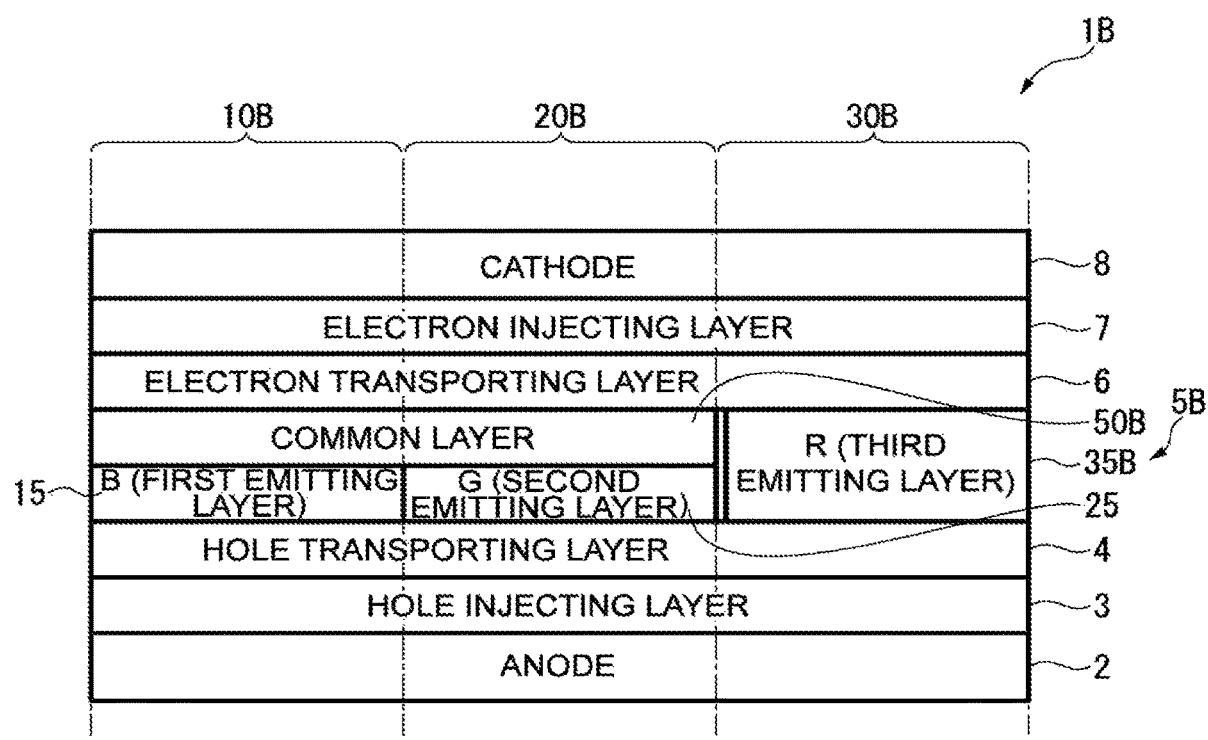
FIG. 5 schematically shows an organic EL apparatus according to a third exemplary embodiment.

FIG. 5 schematically shows an organic EL apparatus 1B according to the third exemplary embodiment. The organic EL apparatus 1B of the third exemplary embodiment is different from the organic EL apparatus 1A of the second exemplary embodiment in that a common layer 50B extends across a first pixel 10B and a second pixel 20B to be shared by the first pixel 10B and the second pixel 20B but is not included in a third pixel 30B. Other components are the same as those in the second exemplary embodiment.

In the exemplary embodiment, the organic EL apparatus 1B in which the first pixel 10B emits blue light, the second pixel 20B emits green light, and the third pixel 30B emits red light is exemplarily described.

The organic EL apparatus 1B includes the anode 2, the hole injecting layer 3, the hole transporting layer 4, an emitting zone 5B, a common layer 50B, the electron transporting layer 6, the electron injecting layer 7, and the cathode 8. The emitting zone 5B includes the first emitting layer 15, second emitting layer 25 and third emitting layer 35B. The third emitting layer 35B is in no contact with the common layer 50B but in contact with the electron transporting layer 6.

In the first pixel 10B and the second pixel 20B of the organic EL apparatus 1B, the anode 2, hole injecting layer 3, hole transporting layer 4, emitting zone 5, common layer 50, electron transporting layer 6, electron injecting layer 7, and cathode 8 are laminated in this order.

First Pixel, Second Pixel and Third Pixel

The first pixel 10B includes the anode 2, hole injecting layer 3, hole transporting layer 4, first emitting layer 15, common layer 50B, electron transporting layer 6, electron injecting layer 7 and cathode 8. The first emitting layer 15 is in contact with the common layer 50B.

The second pixel 20B includes the anode 2, hole injecting layer 3, hole transporting layer 4, second emitting layer 25, common layer 50B, electron transporting layer 6, electron injecting layer 7 and cathode 8. The second emitting layer 25 is in contact with the common layer 50B.

The third pixel 30B includes the anode 2, hole injecting layer 3, hole transporting layer 4, third emitting layer 35B, electron transporting layer 6, electron injecting layer 7 and cathode 8. The third emitting layer 35B is in contact with the electron transporting layer 6.

The first emitting layer 15 and the second emitting layer 25 are the same as those in the second exemplary embodiment. The third emitting layer 35B is the same as the third emitting layer 35 of the first and second exemplary embodiments except that the third emitting layer 35B is in no contact with the common layer 50B but in contact with the electron transporting layer 6.

The peak wavelength of the emission from the first emitting layer 15 is preferably smaller than the peak wavelength of the emission from the second emitting layer 25, and further the peak wavelength of the emission from the second emitting layer 25 is preferably smaller than the peak wavelength of the emission from the third emitting layer 35. In addition, the relationship between the compounds in the emitting layers in the first and second exemplary embodiments is preferably applicable to the third exemplary embodiment.

Also in the exemplary embodiment, since the emitting layer of each pixel of the organic EL apparatus 1B is not a phosphorescent layer but the fluorescent layer (i.e., the first emitting layer 15) or the emitting layer containing the delayed fluorescent compound (i.e., the second emitting layer 25), a variety of choice of compounds usable for the common layer 50B extending across a plurality of pixels to be shared by the pixels can be given and a lifetime of the organic EL apparatus 1B can be prolonged.

Moreover, a drive voltage of the organic EL apparatus 1B can be reduced as compared with an organic EL apparatus including the phosphorescent layer.

Modification of Embodiments

It should be noted that the invention is not limited to the above exemplary embodiments. The invention may include any modification and improvement compatible with the invention.

For instance, although the above exemplary embodiments are described with reference to the examples in which the pixels respectively emit red light, green light and blue light, the invention is not limited to the exemplary embodiments. Examples of the emission colors exhibited by the pixels include yellow, orange, light blue, violet and white.

Although the above exemplary embodiments with the common layer extending across two or three pixels to be shared by the pixels are described as examples, the invention is not limited to the above exemplary embodiments. For instance, the common layer may extend across four or more pixels to be shared by the pixels.

Although the above exemplary embodiments in which the first pixel emits blue light, the second pixel emits green light and the third pixel emits red light are described as examples, the invention is not limited to the exemplary embodiments. For instance, the first pixel may emit blue light, the second pixel may emit red light, and the third pixel may emit green light.

The order of laminating the common layer and the non-common layer is not limited to the order exemplarily described in the above exemplary embodiments. For instance, the non-common layer may be provided between the common layer and the anode, or alternatively, may be provided between the common layer and the cathode. For instance, in the organic EL apparatus of the first exemplary embodiment, the first emitting layer of the first pixel may be provided between the electron transporting layer and the common layer, and the second and third emitting layers may be provided between the hole transporting layer and the common layer.

Although the above exemplary embodiments in which the fluorescent compound is contained in the emitting layer containing the delayed fluorescent compound (occasionally referred to as a delayed fluorescent layer) such as the second emitting layer and the third emitting layer are described as examples, the invention is not limited to the above exemplary embodiments. For instance, the delayed fluorescent layer as the second emitting layer may be a two-component emitting layer containing the delayed fluorescent second compound and the sixth compound without containing a fluorescent compound. In this arrangement, the second compound and the sixth compound preferably satisfy the relationship of the singlet energy S1 and the relationship of the energy gap $T_{77K}$ at 77K described in the above exemplary embodiments.

Moreover, the sixth compound is also preferably the host material. When the sixth compound is the host material, the delayed fluorescent second compound is also preferably used as a luminescent material. In the arrangement that the delayed fluorescent compound emits light as the luminescent material, energy is transferred from the lowest triplet state $T_1(M6)$ of the sixth compound by Dexter energy transfer to generate the lowest singlet state $S_1(M2)$ or the lowest triplet state $T_1(M2)$ of the second compound. Further, when a material having a small $\Delta ST$ is used as the second compound, inverse intersystem crossing from the lowest triplet state $T_1(M2)$ to the lowest singlet state $S_1(M2)$ can be caused by a heat energy. As a result, emission from the lowest singlet state $S_1(M2)$ of the second compound can be observed. It is inferred that the internal quantum efficiency can be theoretically raised up to 100% also by using delayed fluorescence by the TADF mechanism.

The same embodiment described herein is also applicable to the third emitting layer.

Although the above exemplary embodiments with the first and third compounds contained in the emitting layer are described as examples, the invention is not limited to the above exemplary embodiments. For instance, the first emitting layer may be formed of a single compound.

Although the third exemplary embodiment in which the third emitting layer 35B of the third pixel is the delayed fluorescent layer is described as an example, the invention is not limited to such an arrangement. For instance, the organic EL apparatus may include a fluorescent layer containing a fluorescent compound in place of the third emitting layer 35B of the third exemplary embodiment.

Although it is described in the second and third exemplary embodiments that the compound satisfying a predetermined condition is preferably used in the common layer, the invention is not limited to such an arrangement. The compound usable in the common layer has a wide variety of choices as compared with the compound used in the phosphorescent layer, and can be suitably selected depending on the emission mechanism of the emitting layer of each pixel and kinds of the compound(s) contained in the emitting layer of each pixel.

The emitting layer of each pixel is not limited to a single layer, but may be provided as laminate by a plurality of emitting layers. When a single pixel has a plurality of emitting layers, at least one of the emitting layers is preferably in direct contact with the common layer or in indirect contact with the common layer through a barrier layer and the like. The plurality of emitting layers contained in the single pixel may be the same or different in the emission type. The plurality of emitting layers contained in the single pixel may be adjacent to each other, or in a so-called tandem-type laminated arrangement in which a plurality of emitting units are laminated through an intermediate layer.

In the organic EL apparatus, the pixels may be spaced apart from each other while sharing the common layer such that the pixels can independently emit light. For instance, the anode may be separately provided for each of the pixels, the layer arrangement from the anode to the hole transporting layer or the emitting layer may be separately provided for each of the pixels, the layer arrangement from the electron transporting layer to the cathode may be separately provided for each of the pixels, and the cathode may be separately provided for each of the pixels. An insulating film and the like may be provided in a gap between the separated pixels.

In order to independently drive the pixels of the organic EL apparatus, a thin-film transistor configured to drive each of the pixels may be formed on the substrate, further pixel electrodes (anode) corresponding to the respective pixels may be formed on the thin-film transistor, and the above-described layers may be formed on the pixel electrodes.

Although the organic EL apparatus in which three or more pixels are provided in parallel is described as an example in the above exemplary embodiments, an organic EL apparatus in which two pixels are provided in parallel may be used. Moreover, the organic EL apparatus may include a plurality of combinations of two or more pixels. For instance, the organic EL apparatus may include a plurality of combinations of three kinds of pixels (i.e., the first pixel, the second pixel and the third pixel).

The organic EL apparatus of the invention, which is not limited to the organic EL apparatus according to the above exemplary embodiments, is applicable to an electronic device.

Further, the specific arrangements and configurations for practicing the invention may be altered to other arrangements and configurations as long as such other arrangements and configurations are compatible with the invention.

EXAMPLES

Examples of the invention will be described below. However, the invention is not limited to Examples.

Compounds used for manufacturing the organic EL apparatus will be shown below.

[Formula 50]

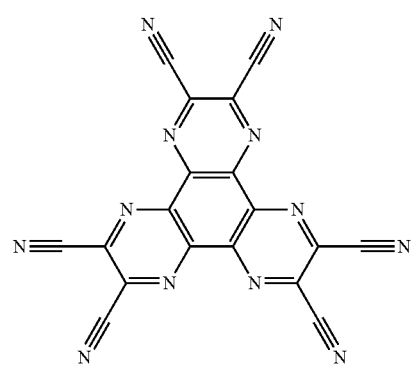

HI1

HT1
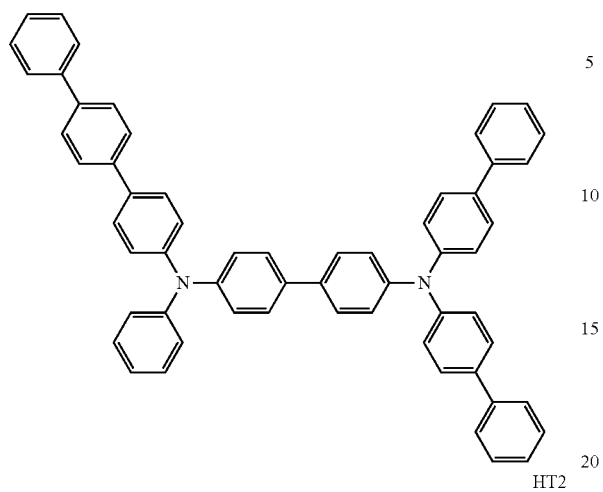
HT2
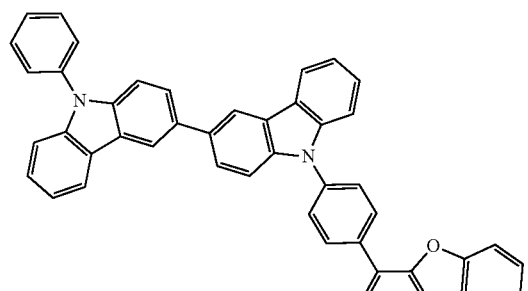
[Formula 51]
GH2
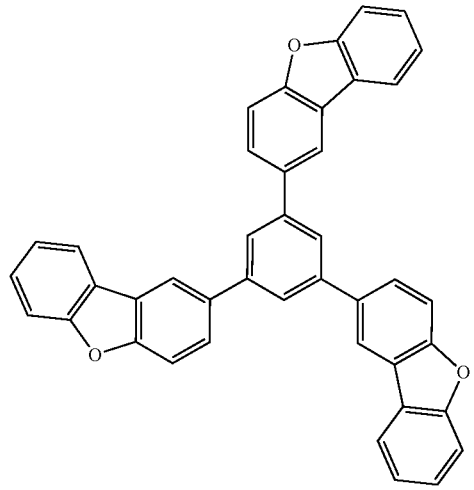
GH1
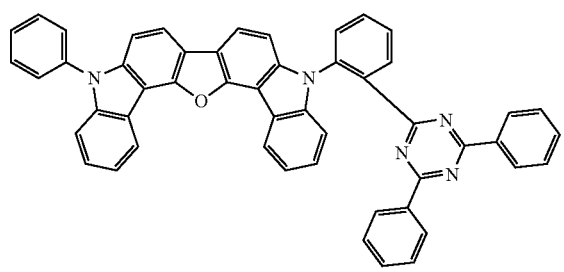
GD1
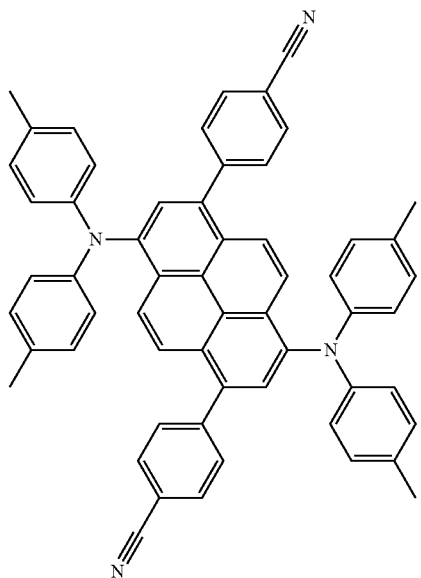
[Formula 52]
BH1
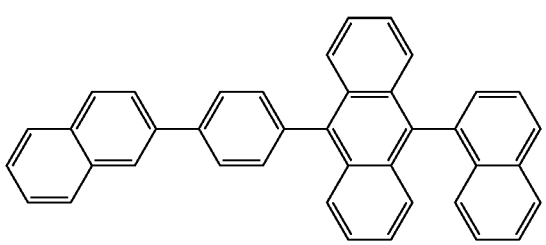
BD1
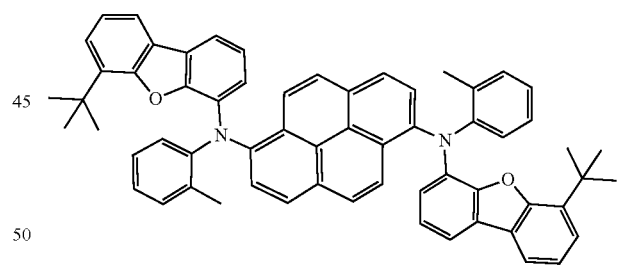
Ir(ppy)$_3$
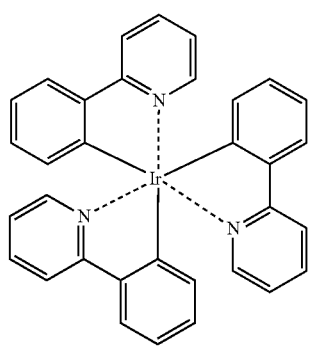

[Formula 53]

EEL1

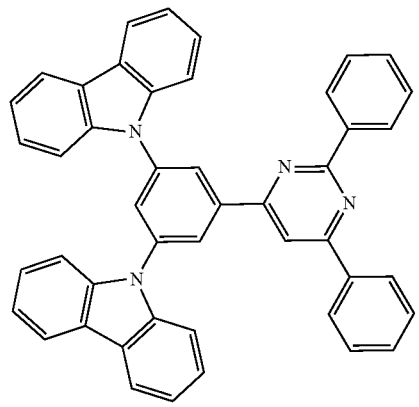

ET1

CBP

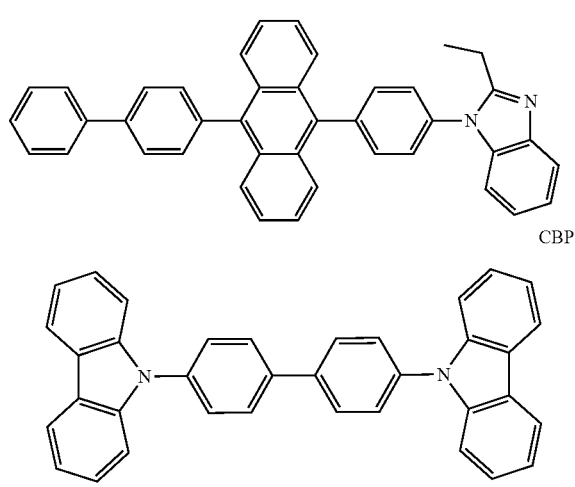

Evaluation of Compounds

Next, properties of the compounds used in Example were measured. A measurement method is shown below.

Delayed Fluorescence

Occurrence of delayed fluorescence was determined by measuring transient photoluminescence (PL) using a device shown in FIG. 2. A sample was prepared by co-depositing compounds GH1 and TH-2 on a quartz substrate at a ratio of the compound GH1 of 12 mass % to form a 100-nm-thick thin film. After the compound GH1 was excited with pulse light (light irradiated from a pulse laser) having a wavelength to be absorbed in the compound GH1, Prompt Emission that was immediately observed in the excited state and Delayed emission that was not observed immediately after the excitation and was later observed were present. Delayed fluorescence in Examples of the invention means that the amount of Delayed emission is 5% or more relative to the amount of Prompt emission. Specifically, when the amount of Prompt emission is denoted by $X_P$ and the amount of Delayed emission is denoted by $X_D$, the delayed fluorescence means that a value of $X_D/X_P$ is 0.05 or more.

It was found in the compound GH1 that the amount of Delayed emission of was 5% or more relative to the amount of Prompt emission. Specifically, it was found that the value of $X_D/X_P$ in the compound GH1 was 0.05 or more.

The amount of Prompt emission and the amount of Delayed emission can be obtained in the same method as a method described in "Nature 492, 234-238, 2012." A device used for calculating the amounts of Prompt Emission and Delayed Emission is not limited to the device of FIG. 2 and a device described in the above document.

A single energy S1 and an energy gap $T_{77K}$ at 77K of each compound were measured in accordance with the above-described measurement method.

An ionization potential Ip of each compound was measured using a photoelectron spectroscope (AC-3: manufactured by RIKEN KEIKI Co., Ltd.) in the atmosphere. Specifically, a target compound was irradiated with light, leading to charge separation, where an amount of the generated electrons was measured to determine the ionization potential Ip.

The measurement values are shown in Table 2.

TABLE 2

| Compound | S1 [eV] | $T_{77K}$ [eV] | Ip [eV] |
|---|---|---|---|
| BH1 | 3.0 | 1.8 | 6.0 |
| BD1 | 2.8 | 2.0 | 5.6 |
| GH1 | 2.7 | — | 5.5 |
| GH2 | 3.8 | 2.9 | 6.5 |
| GD1 | 2.4 | 1.9 | 5.5 |
| EEL1 | 3.6 | 2.9 | 6.1 |
| ET1 | 3.0 | 1.8 | 6.0 |

Manufacturing of Organic EL Apparatus

The organic EL apparatus including the first pixel and the second pixel was manufactured as follows.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum vapor deposition apparatus. Firstly, the compound H11 was deposited on a surface of the glass substrate, where the transparent electrode line was provided, in a manner to cover the transparent electrode, thereby forming a hole injecting layer of each of the first pixel and the second pixel. A film thickness of the hole injecting layer was 5 nm.

Next, a compound HT1 was deposited on the hole injecting layer to form a first hole transporting layer of each of the first pixel and the second pixel. The first hole transporting layer of the first pixel was 90 nm thick and the first hole transporting layer of the second pixel was 135 nm thick.

Next, a compound HT2 was deposited on the first hole transporting layer to form a second hole transporting layer of each of the first pixel and the second pixel. A film thickness of the second hole transporting layer was 15 nm.

Next, the second emitting layer was formed on the second hole transporting layer in the second pixel. Initially, a compound GH2, a delayed fluorescent compound GH1, and a fluorescent compound GD1 were co-deposited to form a 25-nm thick second emitting layer. In the second emitting layer, a concentration of the compound GH1 was 49 mass % and a concentration of the compound GD1 was 1 mass %. A compound BH1 and a fluorescent compound BD1 were co-deposited on the second emitting layer to form a common layer. A film thickness of the common layer was 20 nm. A concentration of the compound BD1 in the common layer was 5 mass %. In this Example, the first emitting layer and the common layer of the first pixel were formed of the same compounds (i.e., the compound BH1 and the compound BD1) such that the common layer serves as the first emitting layer in the first pixel.

Next, a compound EEL1 was deposited on the common layer to form a block layer of each of the first pixel and the second pixel. A film thickness of the block layer was 5 nm.

Next, a compound ET1 was deposited on the block layer to form an electron transporting layer of each of the first pixel and the second pixel. A film thickness of the electron transporting layer was 20 nm.

Next, lithium fluoride (LiF) was deposited on the electron transporting layer to form an electron injecting layer of each of the first pixel and the second pixel. A film thickness of the electron injecting layer was 1 nm.

A metal aluminum (Al) was then deposited on the electron injecting layer to form a cathode of each of the first pixel and the second pixel. A film thickness of the cathode was 80 nm.

An arrangement of the organic EL apparatus in Example 1 is shown in symbols as follows.

First Pixel:
ITO(130)/HI1(5)/HT1(90)/HT2(15)/BH1:BD1(20,BD1: 5%)/EEL1(5)/ET1(20)/LiF(1)/Al(80)

Second Pixel:
ITO(130)/H11(5)/HT1(135)/HT2(15)/GH2:GH1:GD1(25, GH1:49%,GD1:1%)/BH1:BD1(20,BD1:5%)/EEL1(5)/ET1 (20)/LiF(1)/Al(80)

Numerals in parentheses represent a film thickness (unit: nm). The numerals represented by percentage in parentheses indicate a ratio (mass %) of the compounds contained in the layers.

Comparative 1

An organic EL apparatus of Comparative 1 was manufactured in the same manner as the organic EL apparatus of Example 1 except that the second emitting layer of Example 1 was changed as follows.

In Comparative 1, CBP and a phosphorescent metal complex Ir(ppy)$_3$ were co-deposited to form a 25-nm thick second emitting layer. A concentration of Ir(ppy)$_3$ was 5 mass %.

An arrangement of the organic EL apparatus in Comparative 1 is shown in symbols as follows.

Second Pixel:
ITO(130)/H11(5)/HT1(135)/HT2(15)/CBP:Ir(ppy)$_3$(25,Ir (ppy)$_3$:5%)/BH1:BD1(20,BD1:5%)/EEL1(5)/ET1(20)/LiF (1)/Al(80)

Numerals in parentheses represent a film thickness (unit: nm). The numerals represented by percentage in parentheses indicate a ratio (mass %) of the compounds contained in the layers.

The first pixel of the organic EL apparatus in Comparative 1 was the same as that in Example 1.

Comparative 2

An organic EL apparatus of Comparative 2 was manufactured in the same manner as the organic EL apparatus of Example 1 except that the second emitting layer of Example 1 was changed as follows.

In Comparative 2, the compound GH2 and Ir(ppy)$_3$ were co-deposited to form a 25-nm thick second emitting layer. A concentration of Ir(ppy)$_3$ was 5 mass %.

An arrangement of the organic EL apparatus in Comparative 2 is shown in symbols as follows.

Second Pixel:
ITO(130)/HI1(5)/HT1(135)/HT2(15)/GH2:Ir(ppy)$_3$(25,Ir (ppy)$_3$:5%)/BH1:BD1(20,BD1:5%)/EEL1(5)/ET1(20)/LiF (1)/Al(80)

Numerals in parentheses represent a film thickness (unit: nm). The numerals represented by percentage in parentheses indicate a ratio (mass %) of the compounds contained in the layers.

The first pixel of the organic EL apparatus in Comparative 2 was the same as that in Example 1.

Evaluation of Organic EL Devices

The second pixels of the organic EL apparatuses manufactured in Example 1 and Comparatives 1 and 2 were measured in terms of a lifetime and a drive voltage. The evaluation results are shown in Table 3.

Lifetime LT80

An initial current density was set at 50 mA/cm$^2$ and a continuous direct-current test was performed. A time elapsed until a luminance intensity was reduced to 80% of an initial luminance intensity at the start of the test was defined as a lifetime (LT80).

Drive Voltage

A voltage (unit: V) was measured when electric current was applied between the ITO transparent electrode and the metal Al cathode such that the current density became 10 mA/cm$^2$.

TABLE 3

| | Compound | | V | ☐☐☐☐ |
|---|---|---|---|---|
| | Second Emitting Layer | Common Layer | [V] | ☐☐☐☐ |
| Example☐ | ☐☐☐☐☐☐☐☐☐☐ | BH1:BD1 | 4.6 | 56 |
| Comparative☐ | ☐☐☐☐☐☐ (☐☐☐ )$_3$ | BH1:BD1 | 5.9 | 24 |
| Comparative 2 | ☐☐☐☐☐☐ (☐☐☐ )$_3$ | BH1:BD1 | 6.0 | 7 |

As shown in Table 3, the second pixel of the organic EL apparatus of Example 1, in which the second emitting layer contained the delayed fluorescent compound, had a longer lifetime than those of Comparatives 1 and 2 in which each second emitting layer contained the phosphorescent compound. The second pixel of Example 1 was driven at a lower voltage than the second pixel of each of Comparatives 1 and 2. From this result, it is considered that the drive voltage for the entire organic EL apparatus in Example 1 is lower than those in Comparatives 1 and 2.

Example 2

An organic EL apparatus of Example 2 was manufactured in the same manner as the organic EL apparatus of Example 1 except that the common layer of Example 1 was changed as follows.

In Example 2, after the second emitting layer was formed, the compound BH1 and the fluorescent compound BD1 were co-deposited to form a 20-nm thick first emitting layer. A concentration of the compound BD1 in the first emitting layer was 5 mass %. Next, the compound ET1 was deposited on the second emitting layer and the first emitting layer to form a 25-nm-thick common layer. The electron injecting layer and the cathode were formed on the common layer in the same manner as in Example 1.

An arrangement of the organic EL apparatus in Example 2 is shown in symbols as follows.
First Pixel:
ITO(130)/HI1(5)/HT1(90)/HT2(15)/BH1:BD1(20,BD1: 5%)/ET1(25)/LiF(1)/Al(80)
Second Pixel:
ITO(130)/H11(5)/HT1(135)/HT2(15)/GH2:GH1:GD1(25, GH1:49%, GD1:1%)/ET1(25)/LiF(1)/Al(80)
Numerals in parentheses represent a film thickness (unit: nm). The numerals represented by percentage in parentheses indicate a ratio (mass %) of the compounds contained in the layers.

Comparative 3 An organic EL apparatus of Comparative 3 was manufactured in the same manner as the organic EL apparatus of Example 2 except that the second emitting layer of Example 2 was changed as follows.

In Comparative 3, CBP and Ir(ppy)$_3$ were co-deposited to form a 25-nm thick second emitting layer. A concentration of Ir(ppy)$_3$ was 5 mass %.

An arrangement of the organic EL apparatus in Comparative 3 is shown in symbols as follows.
Second Pixel:
ITO(130)/HI1(5)/HT1(135)/HT2(15)/CBP:Ir(ppy)$_3$(25, Ir(ppy)3:5%)/ET1(25)/LiF(1)/Al(80)
Numerals in parentheses represent a film thickness (unit: nm). The numerals represented by percentage in parentheses indicate a ratio (mass %) of the compounds contained in the layers.

The first pixel of the organic EL apparatus in Comparative 3 was the same as that in Example 2.

Comparative 4

An organic EL apparatus of Comparative 4 was manufactured in the same manner as the organic EL apparatus of Example 2 except that the second emitting layer of Example 2 was changed as follows.

In Comparative 4, the compound GH2 and Ir(ppy)$_3$ were co-deposited to form a 25-nm thick second emitting layer. A concentration of Ir(ppy)$_3$ was 5 mass %.

An arrangement of the organic EL apparatus in Comparative 4 is shown in symbols as follows.
Second Pixel:
ITO(130)/HI1(5)/HT1(135)/HT2(15)/GH2:Ir(ppy)$_3$(25, Ir(ppy)$_3$:5%)/ET1(25)/LiF(1)/Al(80)
Numerals in parentheses represent a film thickness (unit: nm). The numerals represented by percentage in parentheses indicate a ratio (mass %) of the compounds contained in the layers.

The first pixel of the organic EL apparatus in Comparative 4 was the same as that in Example 2.

Evaluation of Organic EL Devices

The second pixels of the organic EL apparatuses manufactured in Example 2 and Comparatives 3 and 4 were measured in terms of a lifetime LT80 and a drive voltage V in the same manner as in Example 1 and the like. The evaluation results are shown in Table 4.

TABLE 4

|  | Compound | | V | ▯▯▯▯ |
| --- | --- | --- | --- | --- |
|  | Second Emitting Layer | Common Layer | [V] | ▯▯▯▯ |
| Example 2 | ▯▯▯▯▯▯▯▯▯▯ | | ET1 | 4.0 | 46 |
| Comparative 3 | ▯▯▯▯▯ (▯▯▯ )$_3$ | | ET1 | 6.2 | 31 |
| Comparative 4 | ▯▯▯▯▯ (▯▯▯ )$_3$ | | ET1 | 6.0 | 8 |

As shown in Table 4, the second pixel of the organic EL apparatus of Example 2, in which the second emitting layer contained the delayed fluorescent compound, had a longer lifetime than those of Comparatives 3 and 4 in which each second emitting layer contained the phosphorescent compound. The second pixel of Example 2 was driven at a lower voltage than the second pixel of each of Comparatives 3 and 4. From this result, it is considered that the drive voltage for the entire organic EL apparatus in Example 2 is lower than those in Comparatives 3 and 4.

Example 3

An organic EL apparatus of Example 3 was manufactured in the same manner as the organic EL apparatus of Example 2 except that the common layer of Example 2 was changed as follows.

In Example 3, after the second emitting layer and the first emitting layer were formed, the compound EEL1 was deposited on the second emitting layer and the first emitting layer to form a 5-nm thick common layer. The electron transporting layer, the electron injecting layer and the cathode were formed on the common layer in the same manner as in Example 1.

An arrangement of the organic EL apparatus in Example 3 is shown in symbols as follows.
First Pixel:
ITO(130)/H11(5)/HT1(90)/HT2(15)/BH1:BD1(20,BD1: 5%)/EEL1(5)/ET1(20)/LiF(1)/Al(80)
Second Pixel:
ITO(130)/H11(5)/HT1(135)/HT2(15)/GH2:GH1:GD1(25, GH1:49%, GD1:1%)/EEL1(5)/ET1(20)/LiF(1)/Al(80)
Numerals in parentheses represent a film thickness (unit: nm). The numerals represented by percentage in parentheses indicate a ratio (mass %) of the compounds contained in the layers.

Comparative 5

An organic EL apparatus of Comparative 5 was manufactured in the same manner as the organic EL apparatus of Example 3 except that the second emitting layer of Example 3 was changed as follows.

In Comparative 5, CBP and Ir(ppy)$_3$ were co-deposited to form a 25-nm thick second emitting layer. A concentration of Ir(ppy)$_3$ was 5 mass %.

An arrangement of the organic EL apparatus in Comparative 5 is shown in symbols as follows.
Second Pixel:
ITO(130)/H1(5)/HT1(135)/HT2(15)/CBP:Ir(ppy)$_3$(25, Ir(ppy)$_3$:5%)/EEL1(5)/ET1(20)/LiF(1)/Al(80)
Numerals in parentheses represent a film thickness (unit: nm). The numerals represented by percentage in parentheses indicate a ratio (mass %) of the compounds contained in the layers.

The first pixel of the organic EL apparatus in Comparative 5 was the same as that in Example 3.

Comparative 6

An organic EL apparatus of Comparative 6 was manufactured in the same manner as the organic EL apparatus of Example 3 except that the second emitting layer of Example 3 was changed as follows.

In Comparative 6, the compound GH2 and Ir(ppy)$_3$ were co-deposited to form a 25-nm thick second emitting layer. A concentration of Ir(ppy)$_3$ was 5 mass %.

An arrangement of the organic EL apparatus in Comparative 6 is shown in symbols as follows.
Second Pixel:
ITO(130)/H11(5)/HT1(135)/HT2(15)/GH2:Ir(ppy)$_3$(25, Ir(ppy)$_3$:5%)/EEL1(5)/ET1(20)/LiF(1)/Al(80)

Numerals in parentheses represent a film thickness (unit: nm). The numerals represented by percentage in parentheses indicate a ratio (mass %) of the compounds contained in the layers.

The first pixel of the organic EL apparatus in Comparative 6 was the same as that in Example 3.

Evaluation of Organic EL Devices

The second pixels of the organic EL apparatuses manufactured in Example 3 and Comparatives 5 and 6 were measured in terms of a lifetime LT80 and a drive voltage V in the same manner as in Example 1 and the like. The evaluation results are shown in Table 5.

TABLE 5

| | Compound | | V | ◻◻◻◻ |
|---|---|---|---|---|
| | Second Emitting Layer | Common Layer | [V] | ◻◻◻◻ |
| Example 3 | ◻◻◻◻◻◻◻◻◻◻ | EEL1 | 4.1 | 30 |
| Comparative 5 | ◻◻◻◻◻ (◻◻◻ )₃ | EEL1 | 6.9 | 25 |
| Comparative 6 | ◻◻◻◻◻ (◻◻◻ )₃ | EEL1 | 7.5 | 9 |

As shown in Table 5, the second pixel of the organic EL apparatus of Example 3, in which the second emitting layer contained the delayed fluorescent compound, had a longer lifetime than those of Comparatives 5 and 6 in which each second emitting layer contained the phosphorescent compound. The second pixel of Example 3 was driven at a lower voltage than the second pixel of each of Comparatives 5 and 6. This result leads to consider that the drive voltage for the entire organic EL apparatus in Example 3 is lower than those in Comparatives 5 and 6.

EXPLANATION OF CODE(S)

1, 1A, 1B . . . organic EL apparatus, 2 . . . anode, 4 . . . hole transporting layer, 6 . . . electron transporting layer, 8 . . . cathode, 10, 10A, 10B . . . first pixel, 15 . . . first emitting layer, 20, 20A, 20B . . . second pixel, 25 . . . second emitting layer, 30, 30A, 30B . . . third pixel, 35, 35B . . . third emitting layer, 50, 50A, 50B . . . common layer.

The invention claimed is:

1. An organic EL apparatus comprising an anode and a plurality of pixels comprising a first pixel and a second pixel, wherein
the first pixel comprises a first emitting layer comprising a fluorescent first compound,
the second pixel comprises a second emitting layer comprising a delayed fluorescent second compound and a fluorescent fifth compound,
the first pixel and the second pixel share a common layer extending across the first pixel and the second pixel, and
a singlet energy $S1(G_{DP})$ of the delayed fluorescent second compound and a singlet energy $S1(G_{DF})$ of the fluorescent fifth compound satisfies $S1(G_{DF}) > S1(G_{DP})$.

2. The organic EL apparatus according to claim 1, wherein the common layer comprises the same compound as the first emitting layer comprises.

3. The organic EL apparatus according to claim 1, wherein the first emitting layer further comprises a third compound, and
a singlet energy $S1(B_D)$ of the fluorescent first compound and a singlet energy $S1(B_H)$ of the third compound satisfy a relationship of $S1(B_H) > S1(B_D)$.

4. The organic EL apparatus according to claim 3, wherein an energy gap $T_{77K}(B_D)$ at 77K of the fluorescent first compound and an energy gap $T_{77K}(B_H)$ at 77K of the third compound satisfy a relationship of $T_{77K}(B_D) > T_{77K}(B_H)$.

5. The organic EL apparatus according to claim 1, wherein the common layer comprises a compound composition different from a compound composition of the first emitting layer and a compound composition of the second emitting layer.

6. The organic EL apparatus according to claim 5, wherein the common layer further comprises a fourth compound.

7. The organic EL apparatus according to claim 6, wherein an ionization potential $Ip(G_{DF})$ of the delayed fluorescent second compound and an ionization potential $Ip(C)$ of the fourth compound satisfy a relationship of $Ip(C) \geq Ip(G_{DF})$.

8. The organic EL apparatus according to claim 6, wherein an ionization potential $Ip(G_{DF})$ of the delayed fluorescent second compound and an ionization potential $Ip(C)$ of the fourth compound satisfy a relationship of $Ip(C) > Ip(G_{DF})$.

9. The organic EL apparatus according to claim 6, wherein the first emitting layer further comprises a third compound.

10. The organic EL apparatus according to claim 9, wherein
an energy gap $T_{77K}(B_H)$ at 77K of the third compound and an energy gap $T_{77K}(C)$ at 77K of the fourth compound satisfy a relationship of $T_{77K}(C) \geq T_{77K}(B_H)$.

11. The organic EL apparatus according to claim 9, wherein
an energy gap $T_{77K}(B_H)$ at 77K of the third compound and an energy gap $T_{77K}(C)$ at 77K of the fourth compound satisfy a relationship of $T_{77K}(C) > T_{77K}(B_H)$.

12. The organic EL apparatus according to claim 9, wherein
a singlet energy $S1(B_H)$ of the third compound and a singlet energy $S1(C)$ of the fourth compound satisfy a relationship of $S1(C) \geq S1(B_H)$.

13. The organic EL apparatus according to claim 9, wherein
a singlet energy $S1(B_H)$ of the third compound and a singlet energy $S1(C)$ of the fourth compound satisfy a relationship of $S1(C) > S1(B_H)$.

14. The organic EL apparatus according to claim 9, wherein
a singlet energy $S1(B_D)$ of the fluorescent first compound and the singlet energy $S1(B_H)$ of the third compound satisfy a relationship of $S1(B_H) > S1(B_D)$.

15. The organic EL apparatus according to claim 9, wherein
an energy gap $T_{77K}(B_D)$ at 77K of the fluorescent first compound and the energy gap $T_{77K}(B_H)$ at 77K of the third compound satisfy a relationship of $T_{77K}(B_D) > T_{77K}(B_H)$.

16. The organic EL apparatus according to claim 5, wherein
the first emitting layer further comprises a third compound, and
a singlet energy $S1(B_D)$ of the fluorescent first compound and a singlet energy $S1(B_H)$ of the third compound satisfy a relationship of $S1(B_H) > S1(B_D)$.

17. The organic EL apparatus according to claim 16, wherein
an energy gap $T_{77K}(B_D)$ at 77K of the fluorescent first compound and an energy gap $T_{77K}(B_H)$ at 77K of the third compound satisfy a relationship of $T_{77K}(B_D) > T_{77K}(B_H)$.

18. The organic EL apparatus according to claim 1, wherein
the second emitting layer further comprises a sixth compound, and
the singlet energy $S1(G_{DF})$ of the delayed fluorescent second compound and a singlet energy $S1(G_{DS})$ of the sixth compound satisfy a relationship of $S1(G_{DS}) > S1(G_{DF})$.

19. The organic EL apparatus according to claim 1, wherein
a peak wavelength of light emitted from the first emitting layer is smaller than a peak wavelength of light emitted from the second emitting layer.

20. The organic EL apparatus according to claim 1, wherein
the fluorescent first compound is a blue fluorescent compound.

21. The organic EL apparatus according to claim 1, wherein
the second emitting layer emits green or red light.

22. The organic EL apparatus according to claim 1, wherein
the common layer does not comprise a delayed fluorescent compound.

23. The organic EL apparatus according to claim 1, wherein
the second emitting layer does not comprise a phosphorescent metal complex.

24. The organic EL apparatus according to claim 1, further comprising a third pixel, wherein
the third pixel comprises a third emitting layer comprising a delayed fluorescent seventh compound, and
the common layer extends across the first pixel, the second pixel and the third pixel to be shared by the first pixel, the second pixel and the third pixel.

25. The organic EL apparatus according to claim 24, wherein
the third emitting layer further comprises a fluorescent eighth compound, and
a singlet energy $S1(R_{DF})$ of the delayed fluorescent seventh compound and a singlet energy $S1(R_{DP})$ of the fluorescent eighth compound satisfy a relationship of $S1(R_{DF}) > S1(R_{DP})$.

26. The organic EL apparatus according to claim 24, wherein
the first pixel is configured to emit a blue light,
the second pixel is configured to emit a green light, and
the third pixel is configured to emit a red light.

27. The organic EL apparatus according to claim 1, wherein
the plurality of pixels comprising the first pixel and the second pixel comprise the anode and a cathode,
the common layer is provided between the anode and the cathode, and
the first emitting layer and the second emitting layer are provided between the common layer and the anode.

28. The organic EL apparatus according to claim 27, further comprising a hole transporting layer provided between the anode and the first emitting layer and between the anode and the second emitting layer.

29. The organic EL apparatus according to claim 27, further comprising an electron transporting layer provided between the cathode and the common layer.

30. The organic EL apparatus according to claim 1, wherein
the common layer is in contact with the first emitting layer and the second emitting layer.

31. An electronic device comprising the organic EL apparatus according to claim 1.

* * * * *